United States Patent
Müller

(10) Patent No.: US 12,225,732 B2
(45) Date of Patent: Feb. 11, 2025

(54) MULTI-STACK FERROELECTRIC MEMORY STRUCTURE

(71) Applicant: Ferroelectric Memory GmbH, Dresden (DE)

(72) Inventor: Stefan Ferdinand Müller, Radebeul (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 193 days.

(21) Appl. No.: 17/663,003

(22) Filed: May 11, 2022

(65) Prior Publication Data

US 2023/0371268 A1     Nov. 16, 2023

(51) Int. Cl.
     *H10B 51/30*      (2023.01)
     *H10B 51/20*      (2023.01)

(52) U.S. Cl.
     CPC ............ *H10B 51/30* (2023.02); *H10B 51/20* (2023.02)

(58) Field of Classification Search
     CPC ............ H01L 29/516; H01L 29/66825; H01L 29/6684; H01L 29/788; H01L 29/7889; H10B 41/20; H10B 41/30; H10B 51/00; H10B 51/10; H10B 51/20; H10B 51/30
     See application file for complete search history.

(56) References Cited

U.S. PATENT DOCUMENTS

| | | |
|---|---|---|
| 10,978,129 B1 | 4/2021 | Muller et al. |
| 11,081,159 B1 | 8/2021 | Jahne et al. |
| 11,189,331 B1 | 11/2021 | Benoist et al. |
| 11,195,589 B1 | 12/2021 | Ocker et al. |

(Continued)

FOREIGN PATENT DOCUMENTS

| | | | |
|---|---|---|---|
| CN | 114639681 A | * 6/2022 | ........ H01L 27/11524 |
| KR | 20230135980 A | * 9/2023 | |
| WO | WO-2019125352 A1 | * 6/2019 | |

OTHER PUBLICATIONS

Florent et al., "First Demonstration of Vertically Stacked Ferroelectric Al Doped HfO2 Devices for NAND Applications", 2017 Symposium on VLSI Technology Digest of Technical Papers, 2 pages.

(Continued)

*Primary Examiner* — Matthew E Warren

(74) *Attorney, Agent, or Firm* — Synergy IP Group AG; Natalie Albrecht

(57) ABSTRACT

Various aspects relate to a memory device including: a plurality of gate layer stacks, wherein each gate layer stack of the plurality of gate layer stacks includes a gate electrode layer and one or more electrically insulating layers; one or more channel structures extending through the plurality of gate layer stacks, wherein the plurality of gate layer stacks and the one or more channel structures correspond to a plurality of field-effect transistor based memory cells, wherein each field-effect transistor based memory cell of the plurality of field-effect transistor based memory cells includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

20 Claims, 15 Drawing Sheets

(56) References Cited

U.S. PATENT DOCUMENTS

| | | |
|---|---|---|
| 11,393,518 B1 | 7/2022 | Ocker |
| 11,443,792 B1 | 9/2022 | Iqbal et al. |
| 11,475,935 B1 | 10/2022 | Ocker |
| 11,508,426 B1 | 11/2022 | Ocker |
| 2019/0130956 A1 | 5/2019 | Müller et al. |
| 2019/0130957 A1 | 5/2019 | Müller |
| 2019/0325963 A1 | 10/2019 | Noack |
| 2020/0027493 A1 | 1/2020 | Müller et al. |
| 2020/0357455 A1 | 11/2020 | Noack et al. |
| 2020/0357470 A1 | 11/2020 | Noack |
| 2021/0005238 A1 | 1/2021 | Müller |
| 2021/0082958 A1 | 3/2021 | Mennenga et al. |
| 2021/0090662 A1 | 3/2021 | Mennenga et al. |
| 2021/0091097 A1 | 3/2021 | Mennenga |
| 2021/0125656 A1 | 4/2021 | Müller |
| 2021/0217454 A1 | 7/2021 | Ocker |
| 2021/0312969 A1 | 10/2021 | Noack et al. |
| 2021/0327901 A1 | 10/2021 | Noack |
| 2021/0336534 A1 | 10/2021 | Iqbal et al. |
| 2022/0020776 A1 | 1/2022 | Mennenga et al. |
| 2022/0060105 A1 | 2/2022 | Iqbal |
| 2022/0122995 A1 | 4/2022 | Ocker et al. |
| 2022/0122996 A1 | 4/2022 | Ocker et al. |
| 2022/0122999 A1 | 4/2022 | Polakowski |
| 2022/0130862 A1* | 4/2022 | Lue ................. H10B 51/20 |
| 2022/0139437 A1 | 5/2022 | Ocker |
| 2022/0139931 A1 | 5/2022 | Ocker |
| 2022/0139932 A1 | 5/2022 | Polakowski |
| 2022/0139933 A1 | 5/2022 | Noack |
| 2022/0139934 A1 | 5/2022 | Müller |
| 2022/0139936 A1 | 5/2022 | Ocker |
| 2022/0139937 A1 | 5/2022 | Müller et al. |
| 2022/0172791 A1 | 6/2022 | Tan et al. |
| 2022/0173114 A1 | 6/2022 | Schenk |
| 2022/0189524 A1 | 6/2022 | Ocker |
| 2022/0189987 A1* | 6/2022 | Mebrahtu ............ H10B 43/35 |
| 2022/0199166 A1 | 6/2022 | Mennenga et al. |
| 2022/0270659 A1 | 8/2022 | Ocker |
| 2022/0277794 A1 | 9/2022 | Noack |
| 2022/0374202 A1 | 11/2022 | Villa et al. |
| 2022/0376114 A1 | 11/2022 | Müller |
| 2023/0041759 A1 | 2/2023 | Noack et al. |
| 2023/0046259 A1 | 2/2023 | Iqbal |
| 2023/0135718 A1 | 5/2023 | Minh et al. |
| 2023/0170029 A1 | 6/2023 | Sivero |
| 2023/0189531 A1 | 6/2023 | Muller |
| 2023/0189532 A1 | 6/2023 | Muller |
| 2023/0223066 A1 | 7/2023 | Muller |
| 2023/0247842 A1 | 8/2023 | Muller |
| 2023/0284454 A1 | 9/2023 | Ocker et al. |
| 2023/0335174 A1 | 10/2023 | Kuzmanov |
| 2023/0360684 A1 | 11/2023 | Sivero |
| 2023/0371268 A1 | 11/2023 | Muller |
| 2023/0380165 A1* | 11/2023 | Pesic ................ H01L 29/78642 |
| 2024/0023340 A1* | 1/2024 | Lim ..................... H10B 41/27 |

OTHER PUBLICATIONS

Kim et al., "A stacked memory device on logic 3D technology for ultra-high-density data storage", 2011 Nanotechnology 22 254006, 8 pages.

Fujiwara et al., "3D Semicircular Flash Memory Cell: Novel Split-Gate Technology to Boost Bit Density", 2019 IEEE EDM19-642, 4 pages.

Lue et al., "A Novel Double-Density Hemi-Cylindrical (HC) Structure to Produce More than Double Memory Density Enhancement for 3D NAND Flash", 2019 IEEE IEDM19-646, 4 pages.

\* cited by examiner

MULTI-STACK FERROELECTRIC MEMORY STRUCTURE

TECHNICAL FIELD

Various aspects relate to a memory cell, a memory device, and methods thereof, e.g., a method of forming a memory device.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
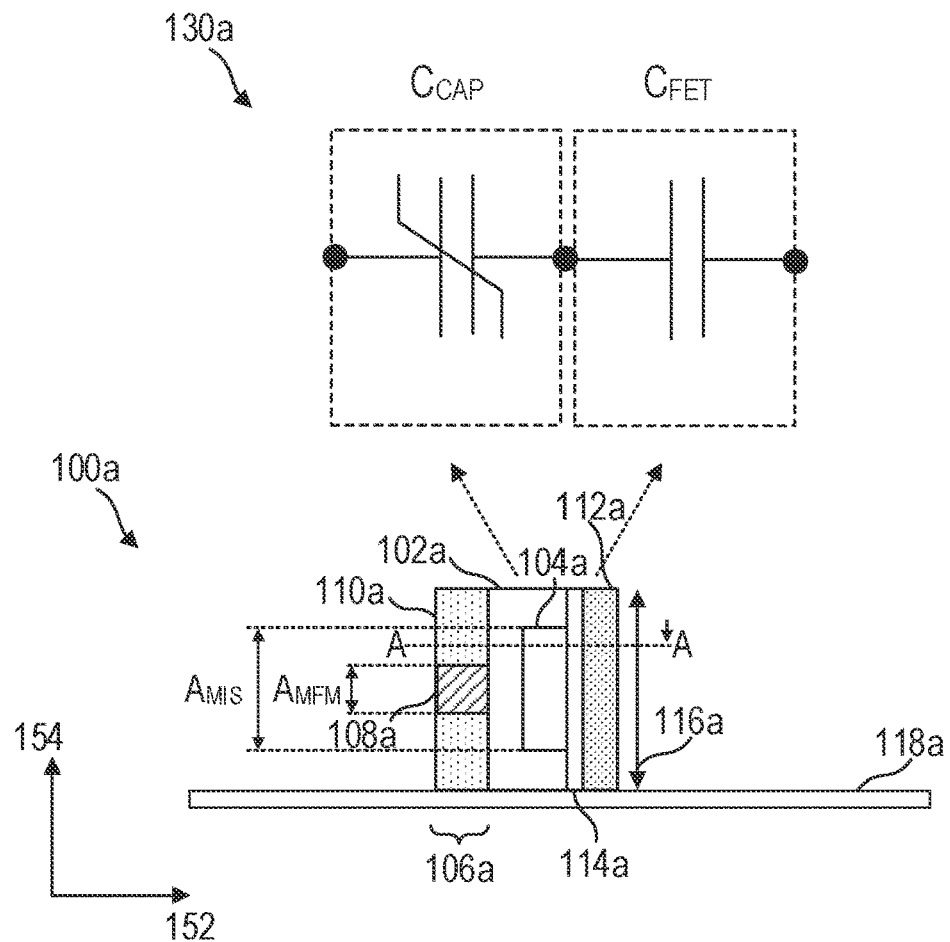
FIG. 1A and FIG. 1B show a memory cell in a schematic view according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory device). However, it is understood that aspects described in connection with methods may similarly apply to the devices, and vice versa.

In memory technology constant efforts are devoted to the development of reliable and efficient architectures for data storage and data transfer (e.g., for enabling fast and efficient writing operations and/or readout operations). In this context, flash memory devices are a well-established solution for long-term data storage. A flash memory device includes a plurality of memory cells, and in each memory cell a floating-gate transistor (e.g., a floating gate metal-oxide-semiconductor field-effect transistor, floating gate MOSFET) controls the writing of data in the memory cell and the readout of data from the memory cell. Flash memory devices find application, for example, in portable electronic devices, such as cameras, mobile phones, and the like. The configuration of a flash memory device allows erasing data in blocks and rewriting data at the byte level, thus making flash memory devices well suited for applications in which large amounts of data are updated at frequent intervals.

In the two most common implementations, a flash memory device may be configured according to a NOR architecture or according to a NAND architecture. A NOR flash memory device is usually implemented in applications that involve writing and reading of individual bytes of data. A NAND flash memory device is configured in blocks for writing, reading, and erasing data. The NAND architecture enables faster speeds for writing operations and readout operations compared to the NOR architecture, making NAND flash devices well suited for applications that involve large sequential data access.

A particular type of NAND flash memory device is the so-called three-dimensional (3D)-NAND flash. A 3D-NAND flash memory device includes memory cells that are vertically stacked in a plurality of layers and are connected to one another by means of vertical interconnections (e.g., stair-like interconnections). Illustratively, a 3D-NAND flash memory device may include a plurality of metal-oxide-semiconductor field-effect transistors (MOSFETs) that are stacked in a plurality of layers. The MOSFETs are connected to control lines that extend horizontally across the device. The 3D-NAND flash architecture provides thus a higher storage density compared to a two-dimensional (2D) planar architecture, in view of the increased number of memory cells (the increased number of MOSFETs) per unit area available for storing data.

However, the 3D-NAND flash architecture has several drawbacks that originate from the internal device physics. As an example, a 3D-NAND flash memory device operates with a high voltage (e.g., around 20 V) for programming and/or erasing a memory cell, thus leading to an increased energy consumption and to a faster deterioration of the device. As another example, the speed at which the memory cells may be written in a 3D-NAND flash memory device is slow compared to other architectures, e.g. the writing speed may be in the range from 10 µs to 10 ms. As a further example, a 3D-NAND flash memory device may have a limited endurance compared to other architectures, e.g. the endurance of a 3D-NAND flash memory device may be limited to a number of cycles in the range from 1000 to 10000. As a further example, the scalability of 3D-NAND flash memory devices is limited due to interference among the memory cells.

A development to overcome the above-mentioned drawbacks consists in the use of ferroelectric field-effect transistor (FeFET)-based memory cells instead of flash memory cells in a 3D-NAND architecture. Illustratively, the MOSFET-based memory cells of a 3D-NAND flash memory device may be replaced with FeFET-based memory cells to provide a 3D-NAND architecture with improved performance. The FeFETs may be arranged vertically in a NAND string. As an example, each FeFET may include a stack of (Poly-Si)—(Al:HfO$_2$)-(Poly-Si). This may be referred to also as Semiconductor-Ferroelectric-Semiconductor (SFS) stack. The polarization state of the ferroelectric layer influences the threshold voltage of the field-effect transistor, thus defining the memory state of the memory cell.

As an example, compared to MOSFET-based memory cells, the use of FeFET-based memory cells allows using lower voltages (e.g., around 5 V) for programming operations and/or erasing operations. As a further example, in a 3D-NAND architecture with FeFET-based memory cells a writing operation may occur at a faster speed compared to MOSFET-based memory cells, e.g. the writing speed may be less than 100 ns. As a further example, a 3D-NAND architecture with FeFET-based memory cells may have better endurance compared to a 3D-NAND flash with MOSFET-based memory cells, e.g. the 3D-NAND architecture with FeFET-based memory cells may have write endurance up to 100000 cycles. As a further example, a 3D-NAND architecture with FeFET-based memory cells may have better scalability compared to a 3D-NAND flash with MOSFET-based memory cells.

However, conventional 3D-NAND architectures with FeFET-based memory cells include FeFET stacks of MFIS-type (Metal-Ferroelectric-Insulator-Semiconductor) or of SFS-type (Semiconductor-Ferroelectric-Semiconductor), which still do not provide satisfactory performance, e.g. in terms of endurance and data retention. For example, the endurance of such stacks may be limited to 100000 cycles due to interface degradation. Illustratively, a SFS stack is subject to cycling degradation and therefore shows only limited endurance capability. Moreover, data retention in this type of stack is not guaranteed due to the depolarization of the ferroelectric layer.

Various aspects of the present disclosure are related to configurations of a memory cell for use in a three-dimensional stacked memory device (e.g., in a memory device having a 3D-NAND architecture). The configurations of a memory cell described herein provide an improvement of the overall capabilities of the memory device with respect to conventional arrangements (e.g., in terms of endurance, data retention, etc.). Illustratively, various aspects are based on the realization of how a memory cell may be configured (e.g., structured) to provide reliable and efficient data storage and data transfer in a three-dimensional stacked architecture.

Various aspects may be based on the realization that some peculiar aspects of flash memory cells (e.g., the presence of a floating gate) may be combined with peculiar aspects of FeFET-based memory cells (e.g., the presence of a spontaneously-polarizable portion as memory element) to provide a memory cell with improved properties for use in a three-dimensional stacked memory device.

According to various aspects, a memory cell for use in a three-dimensional stacked architecture may include a spontaneously-polarizable portion and a floating gate, thus combining the improved endurance capabilities of spontaneously-polarizable materials with a reduced degradation of the stack. The memory cells described in the present disclosure may thus be configured according to the realization that a memory cell including a spontaneously-polarizable memory element provides improved capabilities with respect to a conventional flash memory cell, and that a stack including a floating gate mitigates or eliminates the drawbacks associated with conventional MFIS-type or of SFS-type stacks in FeFET-based architectures.

In addition, various aspects may be related to how such memory cell(s) may be fabricated. Illustratively, various aspects may be based on the realization of how the fabrication of a three-dimensional stacked memory device may be adapted to provide memory cells having a floating gate and a spontaneously-polarizable portion. The fabrication strategies described herein allow providing a memory device with a three-dimensional stacked architecture and having improved capabilities with respect to conventional stacked memory devices (e.g., 3D flash memory devices, or conventional 3D FeFET-based memory devices).

According to various aspects, a 3D-NAND FeFET integration is described, which allows incorporating a MFMIS-type (Metal-Ferroelectric-Metal-Insulator-Semiconductor) FeFET into a 3D-NAND architecture. The integration concept allows for a variation of the capacitance ratio of the upper MFM capacitor and the serially connected MIS capacitor of the total MFMIS structure by modifying the thicknesses of certain layers in the 3D-NAND architecture. The adjustment of the capacitance ratio allows tuning the properties of the memory cell, e.g. in terms of voltage drop across the spontaneously-polarizable layer, in terms of depolarization field, etc.

According to various aspects, a memory device may include: a plurality of gate layer stacks, wherein each gate layer stack of the plurality of gate layer stacks includes a gate electrode layer and one or more electrically insulating layers; one or more channel structures extending through the plurality of gate layer stacks, wherein the plurality of gate layer stacks and the one or more channel structures correspond to a plurality of field-effect transistor based memory cells, wherein each field-effect transistor based memory cell of the plurality of field-effect transistor based memory cells includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

According to various aspects, a memory device may include: a first memory cell and a second memory cell, wherein the first memory cell includes a first gate layer portion, wherein the first gate layer portion includes a first gate electrode layer and one or more first electrically insulating layers, wherein the second memory cell includes a second gate layer portion, wherein the second gate layer portion includes a second gate electrode layer and one or more second electrically insulating layers; and a channel structure extending through the first gate layer portion and the second gate layer portion, wherein the channel structure includes a first channel portion corresponding to the first memory cell and further includes a second channel portion corresponding to the second memory cell, wherein the first memory cell further includes a first spontaneously-polarizable portion and a first floating gate, wherein the first spontaneously-polarizable portion and the first floating gate are disposed between the first gate layer portion and the first channel portion, wherein the second memory cell further includes a second spontaneously-polarizable portion and a second floating gate, wherein the second spontaneously-polarizable portion and the second floating gate are disposed between the second gate layer portion and the second channel portion, wherein the first gate layer portion, the first floating gate, and the first channel portion form a first field-effect transistor structure, and wherein the second gate layer portion, the second floating gate, and the second channel portion form a second field-effect transistor structure.

According to various aspects, a memory device may include: a plurality of gate layer stacks, wherein each gate layer stack includes a gate electrode layer and one or more electrically insulating layers; and one or more channel structures extending through the plurality of gate layer stacks, wherein the a first gate layer stack of the plurality of gate layer stacks includes a first gate layer portion corresponding to a first field-effect transistor based memory cell, and wherein a second gate layer stack of the plurality of gate layer stacks includes a second gate layer portion corresponding to a second field-effect transistor based memory cell, wherein a channel structure of the one or more channel structures includes a first channel portion corresponding to the first field-effect transistor based memory cell and further includes a second channel portion corresponding to the second field-effect transistor based memory cell, wherein a first spontaneously-polarizable portion and a first floating gate are disposed between the first gate layer portion and the first channel portion, wherein a second spontaneously-polarizable portion and a second floating gate are disposed between the second gate layer portion and the second channel portion, wherein the first gate layer portion, the first spontaneously-polarizable portion, the first floating gate, and the first channel portion form the first field-effect transistor based memory cell, and wherein the second gate layer portion, the second spontaneously-polarizable portion, the second floating gate, and the second channel portion form the second field-effect transistor based memory cell.

According to various aspects, a field-effect transistor device may include: a plurality of gate layer stacks, wherein each gate layer stacks of the plurality of gate layer stacks includes a gate electrode layer and one or more electrically insulating layers, one or more channel structures extending through the plurality of gate layer stacks, wherein the plurality of gate layer stacks and the one or more channel structures correspond to a plurality of field-effect transistor structures, wherein each field-effect transistor structure of the plurality of field-effect transistor structures includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

According to various aspects, a method of forming a memory device is provided, the method including: forming a plurality of gate layer stacks over a (planar) substrate, wherein a gate layer stack of the plurality of gate layer stacks includes a gate electrode layer and one or more electrically insulating layers; forming one or more channel-recesses extending through the plurality of gate layer stacks; forming a plurality of side-cavities, wherein a side-cavity of the plurality of side-cavities is disposed between a gate layer portion of a gate layer stack of the plurality of gate layer stacks and a channel-recess of the one or more channel-recesses; forming a plurality of spontaneously-polarizable portions and a plurality of floating gates, wherein a spontaneously-polarizable portion of the plurality of spontaneously-polarizable portions and a floating gate of the plurality of floating gates are disposed in a side-cavity of the plurality of side-cavities; and forming one or more channel structures in the one or more channel-recesses.

The term "gate layer portion" may be used herein to describe a control portion of a field-effect transistor structure (e.g., the control portion of a field-effect transistor-based memory cell). A "gate layer portion" may allow providing a control voltage (e.g., a gate voltage) to the field-effect transistor structure. A "gate layer portion" may include one or more electrically conductive layers (e.g., one or more gate electrode layers) and one or more electrically insulating layers. Providing a voltage at the "gate layer portion" (e.g., providing a voltage at the one or more gate electrode layers) may cause a voltage drop across (in other words, over) the field-effect transistor structure (e.g., over a spontaneously-polarizable portion of a field-effect transistor-based memory cell). According to various aspects, a "gate layer portion" may be provided from a gate layer stack. Illustratively, a gate layer stack may be partitioned into one or more gate layer portions, each corresponding to a respective field-effect transistor structure (e.g., each corresponding to a respective field-effect transistor-based memory cell).

The term "floating gate" may be used herein to describe a further gate of a field-effect transistor structure. The "floating gate" may be separated from the gate electrode layer(s) of the field-effect transistor structure, e.g. there may be one or more electrically insulating layers (e.g., one or more dielectric layers) disposed between the gate electrode layer and the floating gate in a field-effect transistor structure. A "floating gate" may not be connected to any terminal, so that a voltage or a current may not be directly provided at the floating gate. Illustratively, a "floating gate" may be electrically isolated, and may be capacitively connected to the other gate electrode layer(s) of a field-effect transistor structure.

The term "direct physical contact" may be used herein to describe the relative arrangement between two elements (e.g., between two components of a memory cell), and may be used to indicate that the two elements are immediately adjacent to one another. Illustratively, in the case that a first element and a second element are in "direct physical contact" with one another, then a direct interface is present between the first element and the second element. The interface between the first element and the second element may be, for example, an interface between a top surface of the first element and a bottom surface of the second element. As another example, the interface between the first element and the second element may be an interface between a first side surface of the first element and a second side surface of the second element.

Figure 1C:
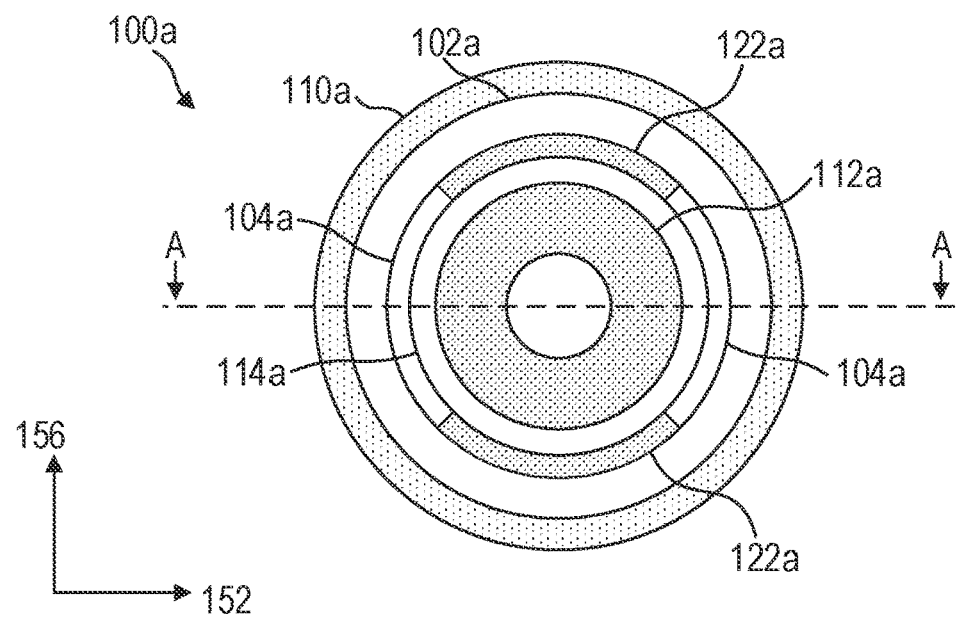
FIG. 1C shows a top view of a memory cell in a schematic view according to various aspects.
Figure 1B:
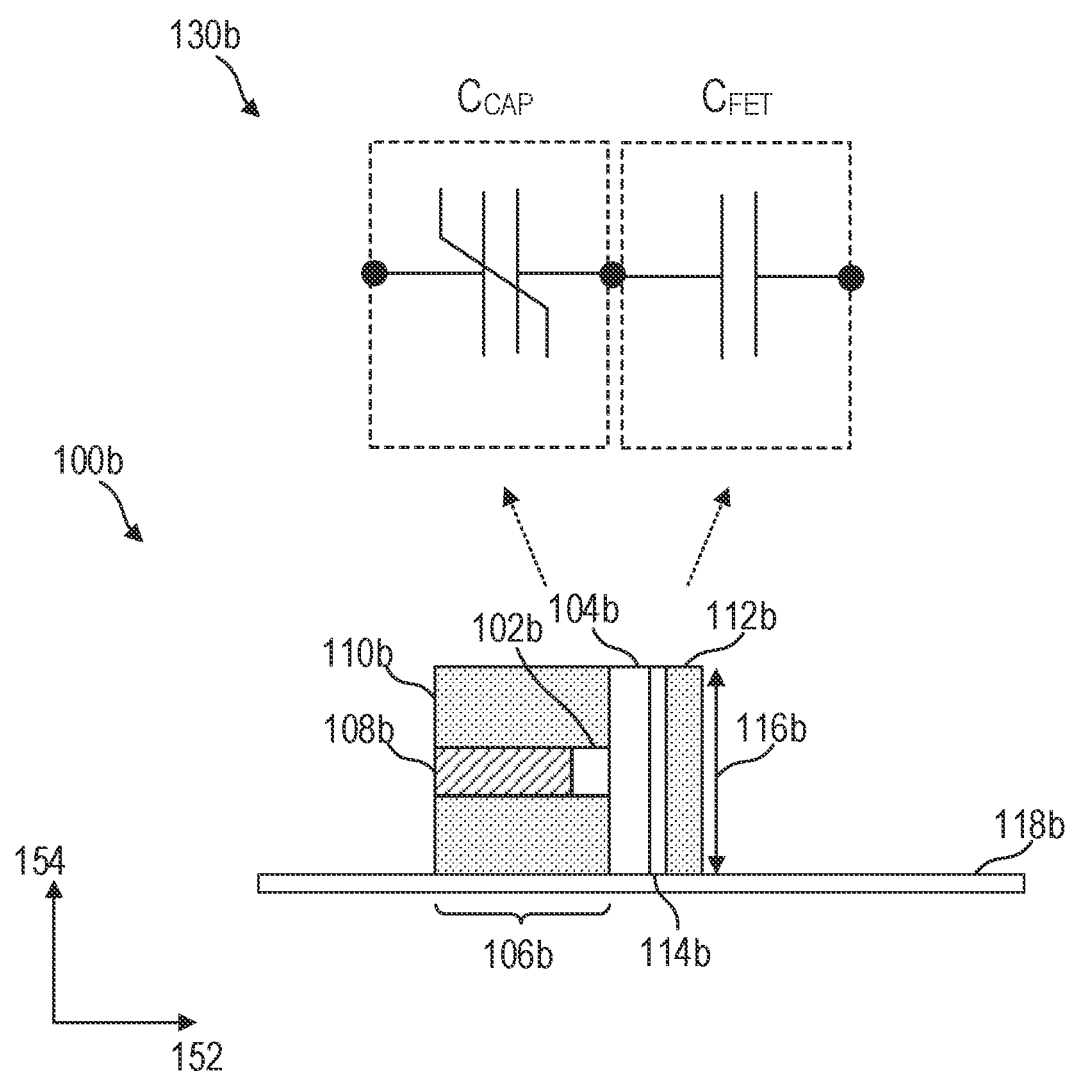

FIG. 1A, and FIG. 1B show a memory cell 100a, 100b in a schematic view, according to various aspects. The memory cell 100a, 100b may be configured (e.g., structured) for use in a three-dimensional stacked memory device, e.g. the memory cell 100a, 100b may be configured for use in a 3D-NAND-architecture (see also FIG. 2A to FIG. 2E). The memory cell 100a, 100b may include a field-effect transistor structure and a capacitive memory structure, which together form the field-effect transistor based (e.g., capacitive) memory cell 100a, 100b. According to various aspects (see also FIG. 1C), the memory cell 100a, 100b may have a symmetric configuration around an axis passing through the center of the memory cell 100a, 100b. Illustratively the representation of the memory cell 100a, 100b in FIG. 1A and FIG. 1B may be understood as a cut view corresponding to a portion of the memory cell 100a, 100b.

The various components of the field-effect transistor structure and of the capacitive memory structure will be described in further detail below. In brief, the capacitive memory structure may include at least two electrode layers and a memory element coupled to the at least two electrode layers. In the configuration in FIG. 1A and FIG. 1B, the capacitive memory structure may include a spontaneously-polarizable portion 102a, 102b as memory element, and the capacitive memory structure may include a gate electrode layer 108a, 108b and a floating gate 104a, 104b as electrode layers. Illustratively, the spontaneously-polarizable portion 102a, 102b may be a functional portion (a memory portion) disposed between the two electrode layers. The spontaneously-polarizable portion 102a, 102b may include (e.g., may consist of) any type of suitable spontaneously-polarizable material (e.g., a remanent-polarizable material, such as a ferroelectric material). According to various aspects, the floating gate 104a, 104b may include (e.g., may be divided into) one or more floating gates 104a, 104b (see FIG. 1C), so that a memory cell 100a, 100b may include (e.g., may be divided into) one or more memory cells, illustratively one or more memory "sub-cells", each corresponding to a respective floating gate 104a, 104b, as discussed in further detail below. The aspects discussed below in relation to a floating gate 104a, 104b may correspondingly apply to each floating gate of one or more floating gates 104a, 104b, and the aspects discussed below in relation to a memory cell 100a, 100b may correspondingly apply to each memory cell of one or more memory "sub-cells".

The field-effect transistor structure may include the gate electrode layer 108a, 108b, the floating gate 104a, 104b, a channel portion 112a, 112b, and a channel-isolation portion 114a, 114b. The channel-isolation portion 114a, 114b may be disposed between the channel portion 112a, 112b and the gate electrode layer 108a, 108b (e.g., between the channel portion 112a, 112b and the floating gate 104a, 104b). The gate electrode layer 108a, 108b may be a control gate of the field-effect transistor structure, e.g. may be a control gate of the memory cell 100a, 100b.

The memory cell 100a, 100b may illustratively include a field-effect transistor structure and may further include a capacitive memory structure integrated in the field-effect transistor structure. In such a configuration the functional portion (e.g., the spontaneously-polarizable portion 102a, 102b) of the memory cell 100a, 100b may be in a capacitive environment, e.g., disposed between two electrode layers (the floating gate 104a, 104b and the gate electrode layer 108a, 108b). In such a memory cell 100a, 100b, the state (e.g., the polarization state) of the functional portion influences the threshold voltage of the field-effect transistor structure. A first polarization state of the spontaneously-polarizable portion 102a, 102b may provide (e.g., define) a first threshold voltage of the field-effect transistor structure, such as a low threshold voltage, and a second polarization state of the spontaneously-polarizable portion 102a, 102b may provide a second threshold voltage of the field-effect transistor structure, such as a high threshold voltage. Illustratively, the polarization state of the spontaneously-polarizable portion 102a, 102b may define a memory state the memory cell 100a, 100b is residing in by influencing the flow of current in the field-effect transistor structure. It is noted that even though various aspects of a memory cell are described herein with reference to a field-effect transistor based capacitive memory structure (such as a ferroelectric field-effect transistor based memory cell, FeFET), which provides an efficient and reliable configuration for a memory cell, other memory structures may be suitable as well.

The overall structure and configuration of the memory cell 100a, 100b is provided having in mind its integration in a three-dimensional stacked memory device. The configuration including both a spontaneously-polarizable portion 102a, 102b and a floating gate 104a, 104b provides improved capabilities (e.g., in terms of endurance, writing speed, and/or data retention) compared to conventional flash memory cells, or compared to conventional FeFET-based memory cells in three-dimensional architectures.

The introduction of the floating gate 104a, 104b provides that the memory cell 100a, 100b has a configuration with an additional metal portion (illustratively, the floating gate 104a, 104b) compared to the conventional MFIS-type or SFS-type configurations in three-dimensional stacked memory devices. According to various aspects, e.g. in the case that the spontaneously-polarizable portion 102a, 102b includes (e.g., consists of) a ferroelectric material, the memory cell 100a, 100b may have a MFMIS-type configuration (Metal-Ferroelectric-Metal-Insulator-Semiconductor). The configuration of the memory cell 100a, 100b enables control of the voltage drop across the capacitive memory structure and across the field-effect transistor structure, which is not possible in conventional 3D-NAND FET-based architectures (which are of MFIS-type or SFS-type). The adaptation of the voltage drop allows improving the writing operations and readout operations of the memory cell 100a, 100b, as well as reducing a deterioration of the memory cell 100a, 100b, as described in further detail below.

The floating gate 104a, 104b enables control of the voltage drop by allowing an adaptation of the capacitive voltage divider configuration provided by the field-effect transistor structure and the capacitive memory structure. As shown by the circuit equivalent 130a, 130b in FIG. 1A and FIG. 1B, the memory cell 100a, 100b may have a first capacitance, $C_{CAP}$, and a second capacitance, $C_{FET}$, associated therewith. The first capacitance, $C_{CAP}$, may be associated with the spontaneously-polarizable portion 102a, 102b, and the second capacitance, $C_{FET}$, may be associated with the channel portion 112a, 112b. Illustratively, the first capacitance, $C_{CAP}$, may be associated with the capacitive memory structure, and the second capacitance, $C_{FET}$, may be associated with the field-effect transistor structure.

The capacitive memory structure in a capacitive configuration may have a (first) capacitance, $C_{CAP}$, defined by the spontaneously-polarizable portion 102a, 102b disposed between the gate electrode layer 108a, 108b and the floating gate 104a, 104b. The first capacitance $C_{CAP}$, may also be indicated herein as $C_{FE}$. The field-effect transistor structure may have a (second) capacitance, $C_{FET}$, defined by the channel portion 112a, 112b, the channel-isolation portion 114a, 114b and the floating gate 104a, 104b. The second capacitance, $C_{FET}$, may originate from the more or less conductive regions (the channel portion 112a, 112b and the floating gate 104a, 104b) separated from one another by the channel-isolation portion 114a, 114b. Illustratively, the channel portion 112a, 112b may be considered as a first capacitor electrode, the floating gate 104a, 104b as a second capacitor electrode, and the channel-isolation portion 114a, 114b as a dielectric medium between the two capacitor electrodes. The second capacitance, $C_{FET}$, may also be indicated herein as $C_{IS}$, or $C_S$.

The (second) capacitance, $C_{FET}$, of the field-effect transistor structure may define one or more operating properties of the field-effect transistor structure. The configuration of the field-effect transistor structure (e.g., the configuration of the channel-isolation portion 114a, 114b) may be adapted according to a desired behavior or application of the field-effect transistor structure during operation (e.g., according to a desired capacitance).

The field-effect transistor structure and the capacitive memory structure may be coupled (e.g., electrically connected) to one another such that a capacitive voltage divider is provided (as illustrated by the circuit equivalent 130a, 130b in FIG. 1A and FIG. 1B). Illustratively, the memory cell 100a, 100b may be understood to include two series connected capacitors as shown in the circuit equivalent 130a, 130b. The capacitive voltage divider formed by the field-effect transistor structure and the capacitive memory structure may allow adapting the capacitances $C_{FET}$, $C_{CAP}$ of the respective capacitors to allow an efficient programming of the memory cell 100a, 100b. The overall gate voltage required for switching the memory cell 100a, 100b from one memory state into another memory state, may become smaller in case the voltage distribution across the field-effect transistor structure and the capacitive memory structure is adapted such that more of the applied gate voltage drops across the spontaneously-polarizable portion 102a, 102b than across the of channel-isolation portion 114a, 114b of the field-effect transistor structure. The overall write voltage (illustratively, applied via nodes to which the field-effect transistor structure and the capacitive memory structure are connected) may thus be reduced by adapting the capacitive voltage divider. The voltage distribution may be determined by voltage divider calculations for a series connection of the capacitors.

In the case that the capacitance, $C_{FET}$, of the field-effect transistor structure is adapted (e.g., by providing a suitable channel-isolation portion 114a, 114b) a predefined fraction of the voltage applied to the series connection may drop across the capacitive memory structure. Accordingly, the electric field generated across the channel-isolation portion 114a, 114b of the field-effect transistor structure underneath the capacitive memory structure could be reduced, if desired. This may lead to a reduced interfacial field stress, which may lead to a reduced wear out of the interface due to, for example, charge injection. Therefore, the reduced electric field may lead to improved endurance characteristics of the memory cell 100a, 100b, that is, to an increased amount of possible state reversals until the memory cell 100a, 100b may lose or change its memory properties.

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

As illustrated in FIG. 1A, the configuration of the memory cell 100a, 100b allows adapting the ratio between the (first) effective area of the capacitor defined by the capacitive memory structure and the (second) effective area of the capacitor defined by the field-effect transistor structure. Illustratively, the dimension(s) of the floating gate 104a, 104b and of the gate electrode layer 108a, 108b may be adapted with respect to one another to adapt accordingly the ratio of the first capacitance, $C_{CAP}$, to the second capacitance, $C_{FET}$. The configuration of the memory cell 100a, 100b (e.g., the MFMIS-type configuration) allows thus adapting the (first) effective area, $A_{MFM}$, of the capacitor defined by the capacitive memory structure by adapting the area of the gate electrode layer 108a, 108b. Furthermore, the configuration of the memory cell 100a, 100b allows adapting the (second) effective area, $A_{MIS}$, of the capacitor defined by the field-effect transistor structure by adapting the area of the floating gate 104a, 104b. Such adaptation of the area ratio $A_{MIS}/A_{MFM}$ (and the corresponding adaptation of the capacitance ratio) is not possible in the conventional MFIS-type or SFS-type configurations. With the configuration described herein a memory cell may be configured to provide an area ratio $A_{MIS}/A_{MFM}$ greater than 1, thus providing an advantageous capacitance ratio for the operation of the memory cell. Illustratively, in various aspects the memory cell 100a, 100b may be configured (e.g., dimensioned) such that the area ratio $A_{MIS}/A_{MFM}$ is greater than 1, e.g. greater than 2, or greater than 5.

In FIG. 1A and FIG. 1B two exemplary configurations of the memory cell 100a, 100b including a spontaneously-polarizable portion 102a, 102b and a floating gate 104a, 104b are illustrated (e.g., two exemplary relative arrangements of the spontaneously-polarizable portion 102a, 102b and the floating gate 104a, 104b). These two exemplary configurations have been found to provide a suitable arrangement for integration in a three-dimensional stacked memory device. Illustratively, these two exemplary configurations may be integrated in a reproducible and efficient manner in a three-dimensional stacked memory device. It is however understood that also other configurations of a memory cell 100a, 100b with a spontaneously-polarizable portion 102a, 102b and a floating gate 104a, 104b may be provided (e.g., other relative arrangements of the various elements). In the exemplary configurations in FIG. 1A and FIG. 1B the spontaneously-polarizable portion 102a, 102b and the floating gate 104a, 104b are disposed adjacent to one another, e.g. the spontaneously-polarizable portion 102a, 102b and the floating gate 104a, 104b are in contact with one another. In other aspects, one or more electrically insulating layers (e.g., one or more dielectric layers) may be disposed between the spontaneously-polarizable portion 102a, 102b and the floating gate 104a, 104b (not shown).

According to various aspects, as shown in FIG. 1A, the spontaneously-polarizable portion 102a may be U-shaped around the floating gate 104a. Illustratively, the spontaneously-polarizable portion 102a may completely laterally surround at least three sidewalls of the floating gate 104a. The floating gate 104a may thus have three interfaces with the spontaneously-polarizable portion 102a, e.g. the floating gate 104a may be in direct physical contact with the spontaneously-polarizable portion 102a at three side surfaces of the floating gate 104a. In this configuration, the floating gate 104a may extend for (only) a part of the channel portion 112a of the field-effect transistor structure. The U-shaped configuration of the spontaneously-polarizable portion 102a provides an increased volume of spontaneously-polarizable material (e.g., compared to the configuration in FIG. 1B), and thus an increased magnitude of the polarization. This may provide a well-defined memory state of the memory cell 100a, 100b by providing a well-defined influence on the current flow in the field-effect transistor structure.

According to other aspects, as shown in FIG. 1B, the spontaneously-polarizable portion 102b may (only) partially cover one side of the floating gate 104b. The other three sides of the floating gate 104b may be free of the spontaneously-polarizable portion 102b. Illustratively, a part of one side of the floating gate 104b may be in direct physical contact with the spontaneously-polarizable portion 102b, whereas the other three sides of the floating gate 104b may be in direct physical contact with other components of the memory cell 100a, 100b. The floating gate 104b may extend for the whole length of the channel portion 112b of the memory cell 100b, and the spontaneously-polarizable portion 102b may extend for (only) a part of the floating gate 104b (e.g., less than 30% of a vertical extension, e.g. a height, of the floating gate 104b, or less than 50%, or less than 70%, as numerical examples). This configuration allows a simpler fabrication process compared to the configuration with a U-shaped spontaneously-polarizable portion 102a, while still providing the possibility of adapting the capacitance ratio of the first capacitance to the second capacitance.

According to various aspects, the gate electrode layer 108a, 108b may be part of a gate layer portion 106a, 106b of the memory cell 100a, 100b. The gate layer portion 106a, 106b may include the gate electrode layer 108a, 108b and a gate electrode isolation 110a, 110b (e.g., the gate electrode isolation 110a, 110b may include one or more electrically insulating layers). The gate layer portion 106a, 106b may define the channel portion 112a, 112b of the field-effect transistor structure. As an example, the channel portion 112a, 112b may be provided in a semiconductor portion of the memory cell 100a, 100b. The gate electrode layer 108a, 108b may allow for a control of an electrical behavior (e.g., for a control of a resistance R) of the channel portion 112a, 112b. A current flow 116a, 116b in the channel portion 112a, 112b may be controlled (e.g., allowed, increased, prevented, decreased, etc.) by providing a control signal, such as a control voltage, at the gate electrode layer 108a, 108b. The channel portion 112a, 112b may also be referred to herein as channel region 112a, 112b. As discussed in further detail below in relation to FIG. 2A to FIG. 2E, the gate layer portion 106a, 106b may be provided from a gate layer stack of a memory device, and the channel portion 112a, 112b may be provided from a channel structure of a memory device. Analogously, the channel isolation portion 114a, 114b may be provided from a channel isolation structure of a memory device.

In some aspects, the gate electrode layer 108a, 108b may allow to control (e.g., allow or prevent) a source/drain current, $I_{SD}$, from a first source/drain region of the field-effect transistor structure to a second source/drain region of the field-effect transistor structure. The source/drains are provided in or adjacent to the channel portion 112a, 112b but are not shown in FIG. 1A and FIG. 1B. The channel portion 112a, 112b and the source/drain regions may be formed, e.g., via doping one or more semiconductor materials or by the use of intrinsically doped semiconductor materials. With respect to the operation of the field-effect transistor structure, a voltage may be provided at the gate electrode layer 108a, 108b to control the current flow 116a, 116b in the channel portion 112a, 112b, with the current flow 116a, 116b in the channel portion 112a, 112b being caused by voltages supplied via the source/drain regions.

According to various aspects, the channel portion 112a, 112b may include or may be made of silicon (e.g., polysilicon). However, other semiconductor materials of various types may be used in a similar way, e.g., germanium, silicon-germanium, Group III to V (e.g., SiC), or other types of materials, including for example carbon nanotubes, organic materials (e.g., organic polymers), etc.

The gate electrode layer 108a, 108b and the floating gate 104a, 104b may include or may be made of an electrically conductive material, for example, a metal material, a metal alloy, a degenerate semiconductor, and/or the like. A degenerate semiconductor may be a semiconductor material having such a high level of doping that the material acts like a metal and not anymore as a semiconductor. As examples, the gate electrode layer 108a, 108b and/or the floating gate 104a, 104b may include or may be made of copper (Cu), aluminum (Al), tungsten (W), titanium nitride (TiN), or tantalum nitride (TaN). As another example, the gate electrode layer 108a, 108b and/or the floating gate 104a, 104b may include or may be made of polysilicon or amorphous silicon. According to various aspects, the gate electrode layer 108a, 108b and/or the floating gate 104a, 104b may include one or more electrically conductive portions, layers, etc. The gate electrode layer 108a, 108b and/or the floating gate 104a, 104b may include, for example, one or more metal layers (also referred to as a metal gate), one or more polysilicon layers (also referred to as poly-Si-gate), and/or one or more amorphous silicon layers, etc. As examples, a metal gate may include or may be made of titanium nitride or tantalum nitride. A poly-Si-gate may be, for example, p-type doped or n-type doped.

The gate electrode isolation 110a, 110b may be configured to provide an electrically insulating portion around the gate electrode layer 108a, 108b. In the context of integration in a three-dimensional stacked memory device, the gate electrode isolation 110a, 110b may provide structural support while avoiding undesired current flow in the memory cell or memory device (see also FIG. 3A to FIG. 4G). The gate electrode isolation 110a, 110b may include one or more electrically insulating layers disposed around the gate electrode layer 108a, 108b. As an exemplary configuration, the gate electrode isolation 110a, 110b may include a first electrically insulating layer and a second electrically insulating layer, and the gate electrode layer 108a, 108b may be disposed between the first electrically insulating layer and the second electrically insulating layer. The one or more electrically insulating layers (e.g., the first electrically insulating layer and/or the second electrically insulating layer) may include or may be made of any suitable electrically insulating material, such as an oxide, a nitride, or an oxynitride. As an example, the one or more electrically insulating layers may include or may be made of silicon oxide or silicon nitride.

According to various aspects, the channel-isolation portion 114a, 114b may be configured to provide an electrical separation of the channel portion 112a, 112b from the gate(s) of the field-effect transistor structure, e.g. from the floating gate 104a, 104b and the gate electrode layer 108a, 108b. Furthermore, the channel-isolation portion 114a, 114b may be configured to influence the channel portion 112a, 112b via an electric field generated by the floating gate 104a, 104b and the gate electrode layer 108a, 108b. The channel-isolation portion 114a, 114b may include one or more electrically insulating layers. As an example, the channel-isolation portion 114a, 114b may include at least two layers including different materials, e.g., a first electrically insulating layer and a second electrically insulating layer. For example, the channel-isolation portion 114a, 114b may include a first dielectric layer including a first dielectric material, for example a low-k material, and a second dielectric layer including a second dielectric material distinct from the first dielectric material, for example a high-k material. As an example, the channel-isolation portion 114a, 114b may include or may be made of an oxide (e.g., silicon oxide), a nitride (e.g., silicon nitride), or an oxynitride (e.g., silicon oxynitride).

The various components of the memory cell 100a, 100b are arranged relative to one another for facilitating integration of the memory cell 100a, 100b in a three-dimensional stacked memory device (see also FIG. 2A to FIG. 2E). In the following, the relative arrangement of the components of the memory cell 100a, 100b is described using as reference a substrate 118a, 118b on or over which the memory cell 100a, 100b may be formed. The substrate 118a, 118b may be a planar substrate, e.g. a substrate with a substantially planar surface. In the exemplary configuration in FIG. 1A and FIG. 1B the memory cell 100a, 100b is illustrated as formed directly on the substrate 118a, 118b. It is however understood that the description of the relative arrangement of the components of the memory cell 100a, 100b may apply in a corresponding manner to the case in which the memory cell 100a, 100b is not formed directly on the substrate, e.g. in the case that one or more further layers (e.g., one or more further memory cells) are disposed between the memory cell 100a, 100b and the substrate 118a, 118b. As an example, the substrate 118a, 118b may be a wafer, e.g. a wafer made of silicon (e.g., p-type doped or n-type doped). In other aspects, the substrate 118a, 118b may be a silicon on insulator (SOI) wafer.

The relative arrangement of the components of the memory cell 100a, 100b is described considering two directions 152, 154 as illustrated in FIG. 1A and FIG. 1B. A first direction 152 may represent a lateral direction in the plane of the substrate 118a, 118b. The first direction 152 may be an in-plane direction, and the first direction 152 may be parallel to the substrate 118a, 118b. Illustratively, the first direction 152 may be a lateral direction parallel to a main surface of the substrate 118a, 118b over which the memory cell 100a, 100b is formed. A second direction 154 may represent a direction out of the plane of the substrate 118a, 118b. The second direction 154 may be an out-of-plane direction, and the second direction 154 may be perpendicular to the substrate 118a, 118b. Illustratively, the second direction 154 may be perpendicular to the (main) surface of the substrate 118a, 118b over which the memory cell 100a, 100b is formed. The first direction 152 and the second direction 154 may be perpendicular to one another.

Stated in a different fashion, the first (lateral) direction 152 may lie in a plane parallel to the substrate 118a, 118b, and the second direction 154 may lie in a plane perpendicular to the substrate 118a, 118b. According to various aspects, the first direction 152 may be a horizontal direction, and the second direction 154 may be a vertical direction. In addition, the relative arrangement of the components of the memory cell 100a, 100b may be described in relation to a third direction 156 (not shown in FIG. 1A and FIG. 1B, see FIG. 2D and FIG. 2E). The third direction 156 may be perpendicular to both the first direction 152 and the second direction 154. The third direction 156 may be a further lateral direction parallel to the substrate 118a, 118b (e.g., may lie in the same plane parallel to the substrate 118a, 118b as the first direction 152). Illustratively, the first direction 152 and the third direction 156 may define a plane parallel to the substrate 118a, 118b. The second direction 154 and the third direction 156 may define a plane perpendicular to the substrate 118a, 118b.

As shown in FIG. 1A and FIG. 1B, the components of the memory cell 100a, 100b may be disposed next to one another along the first direction 152. Illustratively, the memory cell 100a, 100b may be structured along the lateral (horizontal) direction, parallel to the substrate 118a, 118b, so that a plurality of memory cells 100a, 100b may be stacked in the vertical direction to form a memory device (see FIG. 2A to FIG. 2E).

According to various aspects, the spontaneously-polarizable portion 102a, 102b and the floating gate 104a, 104b may be disposed between the gate layer portion 106a, 106b and the channel portion 112a, 112b. The gate layer portion 106a, 106b, the spontaneously-polarizable portion 102a, 102b, the floating gate 104a, 104b, and the channel portion 112a, 112b may be disposed one after the other along the first direction 152 (e.g., the horizontal direction). As an example, the gate layer portion 106a, 106b may be in contact with the spontaneously-polarizable portion 102a, 102b. For example, the gate electrode layer 108a and the gate isolation 110a may be in direct physical contact with the spontaneously-polarizable portion 102a, as shown in FIG. 1A. As another example, only the gate electrode layer 108b may be in direct physical contact with the spontaneously-polarizable portion 102b, as shown in FIG. 1B.

The spontaneously-polarizable portion 102a, 102b may be in contact with the floating gate 104a, 104b, as described above. The floating gate 104a, 104b may be in contact with the channel-isolation portion 114a, 114b (e.g., the floating gate 104a, 104b may be in direct physical contact with the channel-isolation portion 114a, 114b), e.g. the channel-isolation portion 114a, 114b may be disposed between the floating gate 104a, 104b and the channel portion 112a, 112b.

According to various aspects, the components of the gate layer portion 106a, 106b may be arranged along the second direction 154 (e.g., the vertical direction). Illustratively, the gate layer portion 106a, 106b may include a stack of layers disposed along the second direction 154 (see also FIG. 2A to FIG. 2E). As an example, as shown in FIG. 1A and FIG. 1B, the gate layer portion 106a, 106b may include: a first electrically insulating layer; the gate electrode layer 108a, 108b disposed on the first electrically insulating layer in the second direction 154; and a second electrically insulating layer disposed on the gate electrode layer 108a, 108b in the second direction 154. The channel portion 112a, 112b of the field-effect transistor structure may extend along the second direction 154, as shown in FIG. 1A and FIG. 1B, e.g. may extend parallel to the gate layer portion 106a, 106b. Illustratively, the channel portion 112a, 112b may extend along a vertical direction, e.g. perpendicular with respect to the substrate 118a, 118b.

According to various aspects, a memory cell (e.g., the memory cell 100a, 100b) may have at least two distinct memory states associated therewith, for example with two distinct electrical conductivities that may be determined to determine in which of the at least two distinct states the memory cell is residing in. A memory cell including a field-effect transistor structure may have a first memory state, for example associated with a low threshold voltage state (referred to as LVT associated with the LVT memory state), and a second memory state, for example associated with a high threshold voltage state (referred to as HVT state associated with the HVT memory state). The high threshold voltage state may be, in some aspects, associated with a lower current flow during readout compared to the low threshold voltage state. The low threshold voltage state may be an electrically conducting state (e.g., associated with a logic memory state "1", also referred to as a programmed memory state or programmed state). The high threshold voltage state may be an electrically non-conducting state, or at least less conducting than the low threshold voltage state (e.g., associated with a logic memory state "0", also referred to as erased memory state or erased state). Illustratively, the first memory state may be associated with a first threshold voltage of the FET-based memory cell, and the second memory state may be associated with a second threshold voltage of the FET-based memory cell.

As mentioned above, the residual polarization of the functional portion (e.g., the residual polarization of the spontaneously-polarizable layer 102a, 102b) may define the memory state a memory cell (e.g., the memory cell 100a, 100b) is residing in. The memory cell may reside in a first memory state in the case that the functional portion is in a first polarization state, and the memory cell may reside in a second memory state in the case that the functional portion is in a second polarization state (e.g., opposite to the first polarization state). As an example, the polarization state of the functional portion may determine the amount of charge stored in the capacitive memory structure. The amount of charge stored in the capacitive memory structure may define a memory state of the memory cell. The threshold voltage of a field-effect transistor structure may be a function of the polarization state of the functional portion, e.g., may be a function of the amount and/or polarity of charge stored in the capacitive memory structure. A first threshold voltage, e.g., a low threshold voltage $V_{L-th}$, may be associated with the first polarization state (e.g., with the first amount and/or polarity of stored charge, for example a positive polarization state). A second threshold voltage, e.g., a high threshold voltage $V_{H-th}$, may be associated with the second polarization state (e.g., with the second amount and/or polarity of stored charge, for example a negative polarization state). A current flow from nodes to which the field-effect transistor structure and the capacitive memory structure are coupled may be used to determine the memory state in which the memory cell is residing in.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

It is understood that the definition of LVT state and HVT state and/or the definition of a logic "0" and a logic "1" and/or the definition of "programmed state" and "erased state" may be selected arbitrarily.

According to various aspects, the spontaneously-polarizable portion 102a, 102b of the memory cell 100a, 100b may include (e.g., may consist of) a polarizable material, e.g., a spontaneously-polarizable material. In various aspects, the spontaneously-polarizable portion 102a, 102b may include at least a region of polarizable material, e.g. one or more regions of polarizable material. A spontaneously-polarizable portion 102a, 102b may show a hysteresis in the (voltage dependent) polarization. The spontaneously-polarizable portion 102a, 102b may show non-remanent spontaneous polarization (e.g., may show anti-ferroelectric properties), e.g., the spontaneously-polarizable portion 102a, 102b may have no or no substantial remanent polarization remaining in the case that no voltage drops across (in other words, over) the spontaneously-polarizable portion 102a, 102b. In other aspects, the spontaneously-polarizable portion 102a, 102b may show remanent spontaneous polarization (e.g., may show ferroelectric properties), e.g., the spontaneously-polarizable portion 102a, 102b may have a remanent polarization or a substantial remanent polarization remaining in the case that no voltage drops across the spontaneously-polarizable portion 102a, 102b.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a remanent polarization as low as 0 $\mu C/cm^2$ to 2 $\mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 2 $\mu C/cm^2$ may be regarded as substantial remanent polarization. Such a substantial remanent polarization may allow for storing information as a function of a polarization state of a spontaneously-polarizable portion or a spontaneously-polarizable material.

In general, a remanent polarization (also referred to as retentivity or remanence) may be present in a material portion in the case that the material portion may remain polarized upon reduction of an applied electric field (E) to zero, therefore, a certain value for the electrical polarization (P) of the material portion may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable portion.

According to various aspects, a capacitive memory structure may be or may include a ferroelectric capacitor (Fe-CAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. Illustratively, the spontaneously-polarizable portion 102a, 102b of the memory cell 100a, 100b (as memory element) may include any type of spontaneously-polarizable material, e.g., a ferroelectric material, an anti-ferroelectric material, an anti-ferroelectric-like material, etc. An information may be stored via at least two remanent polarization states of the capacitive memory structure. The programming of the capacitive memory structure (illustratively the storage of information therein) may be carried out by providing an electric field between the electrode layers to thereby set or change the remanent polarization state of the capacitive memory structure (illustratively, of the spontaneously-polarizable portion 102a, 102b). Illustratively, a spontaneous-polarizable material (e.g., a ferroelectric material, e.g., an anti-ferroelectric material) may be used to store data in a non-volatile manner in integrated circuits.

According to various aspects, the spontaneously-polarizable portion 102a, 102b may include (e.g., may consist of) a remanent-polarizable material. A remanent-polarizable material may be a material that is remanently polarizable and shows a remanence of the spontaneous polarization, such as a ferroelectric material. In other aspects, a remanent-polarizable material may be a material that is spontaneously-polarizable and that shows no remanence, e.g., an anti-ferroelectric material under the additional conditions that measures are implemented to generate an internal electric-field within the anti-ferroelectric material. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples.

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, a spontaneous-polarizable material (e.g., a remanent-polarizable material) may be or may include a ferroelectric material. The ferroelectric material may be or may include a (ferroelectric) metal oxide, e.g. at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

FIG. 1C shows a schematic top view of the memory cell 100a, as seen from the line A-A in FIG. 1A, according to various aspects. It is understood that the aspects discussed in relation to the configuration of the memory cell 100a in FIG. 1C may apply in a corresponding manner to the configuration of the memory cell 100b. In FIG. 1C the memory cell 100a is illustrated as having a circular cross-section as seen from the top. A circular cross-section has been found to provide a suitable configuration for a simple integration in a three-dimensional stacked memory device. It is however understood that a memory cell 100a, 100b may also have other configurations, e.g. with a cross-section shaped in a different manner, such as square-shaped, rectangular-shaped, etc. (see also FIG. 2D and FIG. 2E). For clarity of representation, the substrate 118a is not shown in FIG. 1C.

According to various aspects, as shown in FIG. 1C, the various components of the memory cell 100a may be continuous portions of material around a central axis of the memory cell 100a. From this configuration, a memory cell 100a (and similarly a memory cell 100b) may be subdivided into one or more memory cells (e.g., sub-cells), by dividing the floating gate 104a into one or more floating gates 104a. Illustratively, a memory cell 100a may be formed including continuous portions of material for forming the various components (see also the fabrication process in FIG. 3A to FIG. 4G), and, if desired, may be further processed to provide a plurality of memory sub-cells from the initial memory cell 100a. Further illustratively, a memory cell 100a (or a memory cell 100b) may be understood as a memory cell structure which may be divided into one or more memory cells (sub-cells, or memory cell portions).

The floating gate 104a of the memory cell 100a (and in a similar manner the floating gate 104b of the memory cell 100b) may be divided into one or more floating gates 104a that are electrically isolated from one another. In the exemplary configuration in FIG. 1C, the floating gate 104a may include (e.g., may be divided into) two floating gates. It is however understood that the floating gate 104a may be divided into any suitable number of floating gates, e.g. two, three, or four, as examples. The electrical isolation between the floating gates of the memory cell 100*a* may be provided in any suitable manner during fabrication.

As an example, after having formed (e.g., deposited) the various components of the memory cell 100*a*, the memory cell 100*a* may be cut through its central axis, thus splitting the memory cell 100*a* into two parts, illustratively into two memory (sub-)cells. The memory cell 100*a* may also be cut through more than one axis in case the memory cell 100*a* should be split into more than two (sub-)cells. In this configuration not only the floating gate but also the other components of the memory cell 100*a* (e.g., the spontaneously-polarizable portion 102*a*, the gate layer portion 106*a*, etc.) may be split into two (or more) parts.

As another example, electrically insulating portions 122*a* may be formed between the floating gates 104*a*, thus defining the memory sub-cells. The electrically insulating portions 122*a* may include (e.g., may consist of) any suitable electrically insulating material, such as an oxide, a nitride, or an oxynitride. The number, the location, and the shape of the electrically insulating portions 122*a* may be adapted depending on the desired sub-division of the floating gate 104*a*. According to various aspects, electrically insulating portions may be formed also to sub-divide the other components of the memory cell 100*a* into a plurality of parts. For example, electrically insulating portions may be formed between parts of the spontaneously-polarizable portion 102*a* that correspond to different memory (sub-)cells. Electrically insulating portions may be disposed between parts of the gate layer portion 106*a* that correspond to different memory (sub-)cells, between parts of the spontaneously-polarizable portion 102*a* that correspond to different memory (sub-)cells, etc.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. According to various aspects, a non-volatile field-effect transistor based memory structure or memory cell may store data for a period of time from hours (e.g., more than 5 hours) to several tens of years (e.g., 10 years, 20 years, etc.), whereas a volatile field-effect transistor based memory structure or memory cell may store data for a period of time from nanoseconds to hours (e.g., less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

It may be understood that, even though various aspects refer to a memory function implemented via a spontaneously-polarizable material, which provides a reliable and reproducible behavior, other types of material whose state may be altered by an electric field provided across a capacitive memory structure may be used.

Figure 2A:
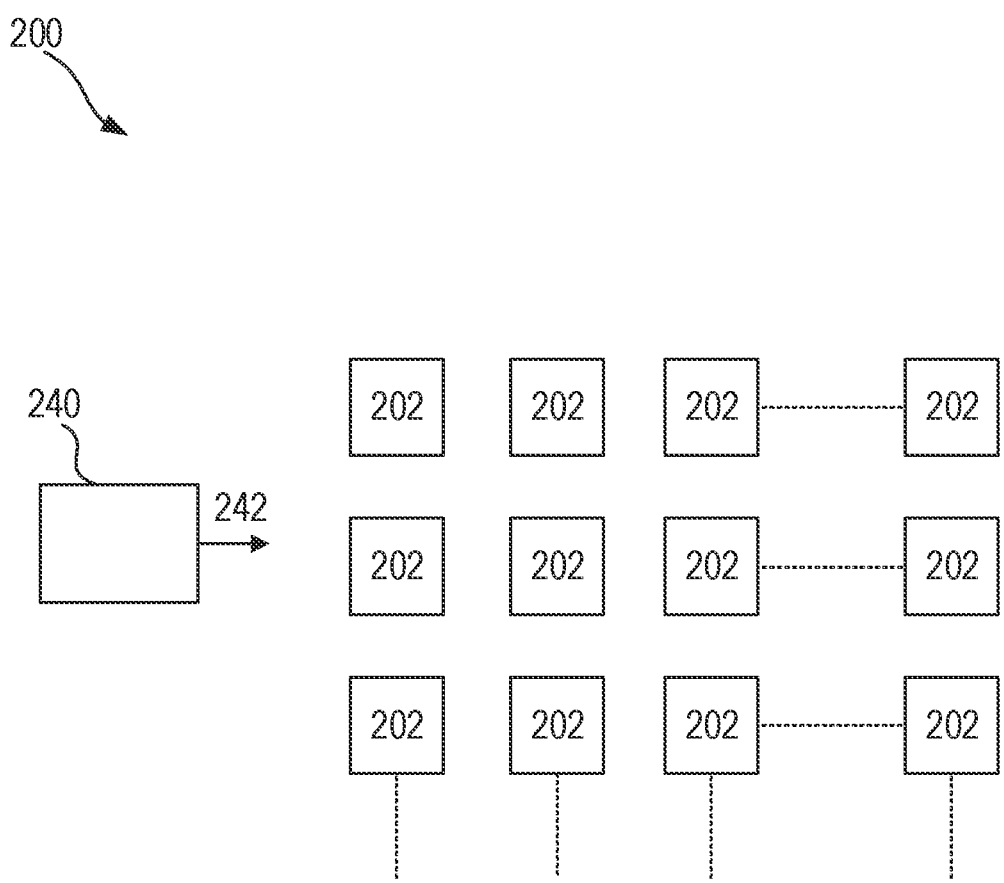
FIG. 2A shows a memory device in a schematic view according to various aspects.

FIG. 2A shows a memory device 200 in a schematic view according to various aspects. The memory device 200 may include a plurality of memory cells 202, e.g., disposed on a semiconductor substrate, such as on a semiconductor wafer. The memory cells 202 of the plurality of memory cells 202 may be configured as the memory cell 100*a*, 100*b* described in relation to FIG. 1A to FIG. 1C. As an example, each memory cell 202 of the plurality of memory cells 202 may be configured as the memory cell 100*a* described in relation to FIG. 1A. As another example, each memory cell 202 of the plurality of memory cells 202 may be configured as the memory cell 100*b* described in relation to FIG. 1B. It is however understood that the memory device 200 may also include a first plurality of memory cells 202 configured as the memory cell 100*a* described in relation to FIG. 1A and a second plurality of memory cells 202 configured as the memory cell 100*b* described in relation to FIG. 1B. The memory device 200 may be a three-dimensional stacked memory device (see also FIG. 2B and FIG. 2C). Illustratively, the memory cells 202 of the plurality of memory cells 202 may be disposed in layers stacked along the vertical direction.

In the simplified representation in FIG. 2A, twelve memory cells 202 (disposed in four columns and three rows) are shown. It is however understood that the memory device 200 may include any number of memory cells 202 (e.g., to implement a desired storage size). In various aspects, the memory device 200 may be or may include a memory cell arrangement, with a matrix disposition of memory cells in a number n of rows and a number m of columns.

The memory device 200 may include a plurality of control lines (not shown) to provide control voltages at the memory cells 202. For example, the memory device 200 may include one or more word-lines, one or more bit-lines, and one or more source-lines. A memory cell 202 may be connected to a respective word-line, a respective bit-line, and a respective source-line. The control lines may be used to supply voltages to the memory cells 202 for performing writing operations and readout operations.

According to various aspects, the memory cells 202 of the plurality of memory cells 202 may be configured (e.g., disposed) to form a 3D-NAND-Architecture. Illustratively, the memory cells 202 of the plurality of memory cells 202 may be connected to one another according to a NAND architecture, e.g. may be connected to one another in a way that enables addressing the memory cells 202 according to a NAND scheme. In a NAND architecture the memory cells 202 may be organized in sectors (also referred to as blocks) of memory cells, wherein the memory cells 202 are serially connected in a string (e.g., source and drain regions are shared by neighboring field-effect transistor structures), and the string is connected to a bit-line and a source-line. For example, groups of memory cells in a NAND architecture may be connected in series with one another.

The memory device 200 may include a control circuit 240 (a memory controller) configured to control the memory cells 202 of the plurality of memory cells 202. The control circuit 240 may be configured to instruct an operation of the memory cells 202, e.g. a writing operation and/or a readout operation. The control circuit 240 may be configured to supply a control signal 242 to the memory cells 202 of the memory device 200 to cause a writing and/or a readout of at least one of the memory cells 202. As an example, the control circuit 240 may include or may control one or more voltage supply circuits. The one or more voltage supply circuits may be used for supplying voltages (e.g., write voltages, readout voltages, inhibit voltages, and the like) to the control lines of the memory device 200. In various aspects, the control circuit 240 may include or may control one or more charge pumps to supply the voltages at the memory cells 202. According to various aspects, the control circuit 240 may define a base voltage, $V_B$, e.g. a ground voltage (for example 0 V) associated with the memory device 200 (the base voltage, $V_B$, may also be referred to herein as reference voltage, $V_{ref}$).

Figure 2B:
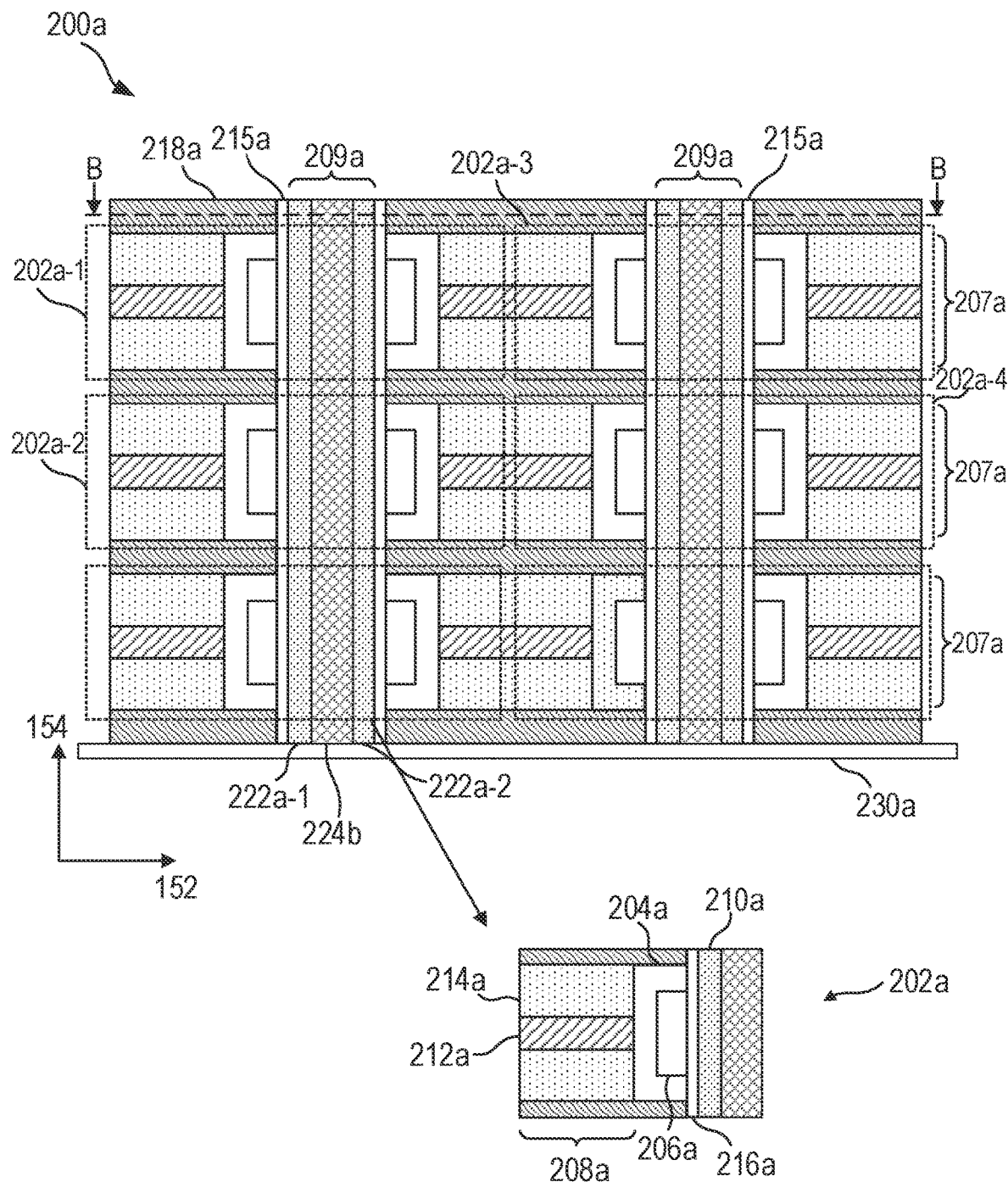
FIG. 2B and FIG. 2C show an integration scheme of a memory device in a schematic view according to various aspects.
Figure 2C:
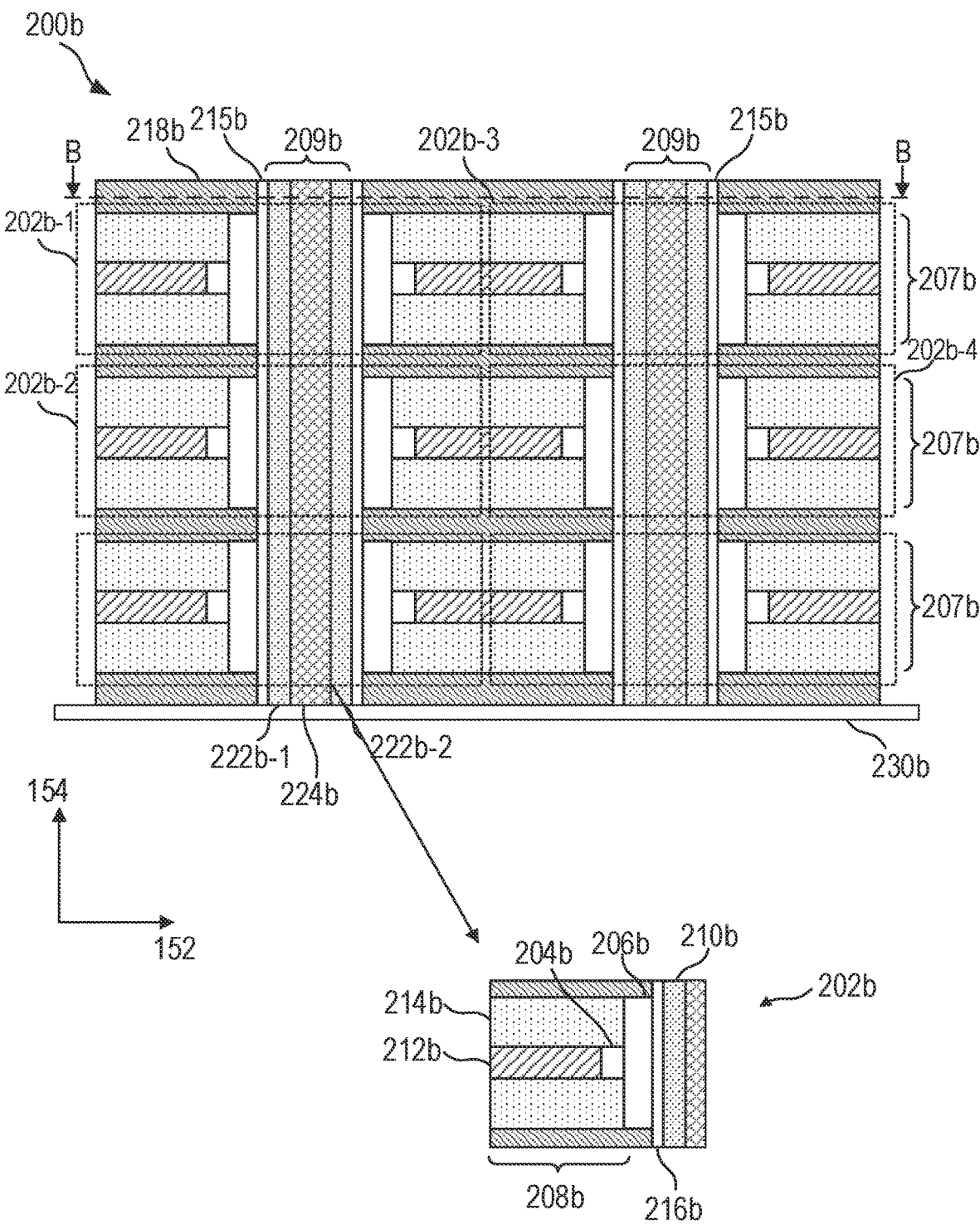

FIG. 2B and FIG. 2C show an integration scheme of a memory device 200a, 200b in a schematic representation according to various aspects. The memory device 200a, 200b may represent an integration scheme of the memory device 200 described in relation to FIG. 2A. In the representation in FIG. 2B, the memory device 200a may include a plurality of memory cells 202a configured as the memory cell 100a described in relation to FIG. 1A. In the representation in FIG. 2C, the memory device 200b may include a plurality of memory cells 202b configured as the memory cell 100b described in relation to FIG. 1B. As discussed above, these two configurations of a memory cell have been found particularly suitable for integration in a three-dimensional stacked memory device 200a, 200b. It is however understood that also other configurations of a memory cell may be provided (e.g., with less, additional, or alternative components, e.g. with less, additional, or alternative layers). It is also understood that the representation in FIG. 2B and FIG. 2C is not to scale.

The memory device 200a, 200b may be configured as three-dimensional stacked memory device (e.g., as a 3D-NAND memory device). Illustratively, the memory device 200a, 200b may include a plurality of memory cells 202a, 202b disposed in a stacked arrangement (illustratively, in a three-dimensional matrix arrangement). For the sake of representation only the components of one memory cell 202a, 202b are labeled in FIG. 2B and FIG. 2C.

Each memory cell 202a, 202b may include a (respective) spontaneously-polarizable portion 204a, 204b, a floating gate 206a, 206b, a gate layer portion 208a, 208b (including a gate electrode layer 212a, 212b and a gate electrode isolation 214a, 214b), a channel portion 210a, 210b and a channel-isolation portion 216a, 216b. The components of the memory cells 202a, 202b may be configured as the respective components described in relation to the memory cell 100a, 100b in FIG. 1A and FIG. 1B.

In relation to the memory device 200a in FIG. 2B, at least one (e.g., each) memory cell 202a may include a spontaneously-polarizable portion 204a that is U-shaped around the floating gate 206a of the memory cell 202a. Illustratively, at least one (e.g., each) memory cell 202a may include a spontaneously-polarizable portion 204a that completely laterally surrounds at least three sidewalls of the floating gate 206a of the memory cell 202a. In relation to the memory device 200b in FIG. 2C, at least one (e.g., each) memory cell 202b may include a spontaneously-polarizable portion 204b that only partially covers the floating gate 206b of the memory cell 202b.

The arrangement of the memory cells 202a, 202b in the memory device 200a, 200b may be described in relation to a (planar) substrate 230a, 230b of the memory device 200a, 200b. Illustratively, the memory device 200a, 200b may include (e.g., may be formed on) a substrate 230a, 230, e.g. a substrate 230a, 230b configured as the substrate 118a, 118b described in relation to FIG. 1A and FIG. 1B. In FIG. 2B to FIG. 2E three directions are represented, namely a first direction 152, a second direction 154, and a third direction 156. The first direction 154 and the third direction 156 may lie in a plane parallel to the substrate 230a, 230b. The second direction 154 may lie in a plane perpendicular to the substrate 230a, 230b. Illustratively, the first direction 154 and the third direction 156 may be lateral directions in a plane parallel to a (planar) surface of the substrate 230a, 230b. The second direction 154 may be a vertical direction.

According to the three-dimensional stacked architecture, the memory device 200a, 200b may include memory cells 202a, 202b disposed in a three-dimensional matrix. Illustratively, the memory cells 202a, 202b may be disposed in rows and columns along the first direction 152, the second direction 154, and the third direction 156. The memory cells 202a, 202b may thus be distributed along the first (horizontal) direction 152, the second (vertical) direction, and the third (horizontal) direction. As an example, the memory device 200a, 200b may include a first memory cell 202a-1, 202b-1 and a second memory cell 202a-2, 202b-2 spaced from one another along the second (vertical) direction 154. As another example, the memory device 200a, 200b may include a first memory cell 202a-1, 202b-1 and a third memory cell 202a-3, 202b-3 spaced from one another along the first (lateral) direction 152. The memory device 200a, 200b may further include a memory cell spaced from the first memory cell 202a-1, 202b-1 along the third (lateral) direction 156.

By way of illustration, the memory device 200a, 200b may include a plurality of gate layer stacks 207a, 207b, and one or more channel structures 209a, 209b extending through the plurality of gate layer stacks 207a, 207b. The one or more channel structures 209a, 209b may extend through the plurality of gate layer stacks 207a, 207b along a direction perpendicular to the substrate 230a, 230b (e.g., along the second, vertical, direction 154). Illustratively, the plurality of gate layer stacks 207a, 207b may be formed on the substrate 230a, 230b, and the one or more channel structures 209a, 209b may be formed in one or more corresponding recesses in the plurality of gate layer stacks 207a, 207b (see also FIG. 3A to FIG. 4G).

The plurality of gate layer stacks 207a, 207b may include a plurality of gate layer portions 208a, 208b wherein each gate layer portion 208a, 208b corresponds to a respective memory cell 202a, 202b (or memory sub-cell). Illustratively, the plurality of gate layer stacks 207a, 207b may be subdivided into a plurality of gate layer portions 208a, 208b, and each memory cell 202a, 202b may include a respective gate layer portion 208a, 208b of the plurality of gate layer portions 208a, 208b. A gate layer stack 207a, 207b may be formed as a stack of continuous layers (see also FIG. 3A to FIG. 4G), and may be logically and/or structurally subdivided into a plurality of portions corresponding to the memory cells 202a, 202b (or memory sub-cells) of the memory device 200a, 200b. It is understood that the aspects discussed in relation to a gate layer portion (e.g., in terms of materials, disposition, etc.) may apply in a corresponding manner to a gate layer stack, and vice versa.

In a corresponding manner, a channel structure 209a, 209b of the plurality of channel structures 209a, 209b may include a plurality of channel portions 210a, 210b wherein each channel portion 210a, 210b corresponds to a respective memory cell 202a, 202b (or memory sub-cell). Illustratively, a channel structure 209a, 209b may be subdivided into a plurality of channel portions 210a, 210b, and each memory cell 202a, 202b may include a respective channel portion 210a, 210b of the plurality of channel portions 210a, 210b. A channel structure 209a, 209b may be formed as a continuous structure (see also FIG. 3A to FIG. 4G), and may be logically and/or structurally subdivided into a plurality of portions corresponding to the memory cells 202a, 202b (or memory sub-cells) of the memory device 200a, 200b. It is understood that the aspects discussed in relation to a channel portion (e.g., in terms of materials, disposition, etc.) may apply in a corresponding manner to a channel structure, and vice versa.

In the exemplary configuration in FIG. 2B and FIG. 2C, the memory device 200a, 200b may include a first channel structure 209a, 209b extending through the plurality of gate layer stacks 207a, 207b (e.g., through a gate layer portion corresponding to a first memory cell 202a-1, 202b-1, a gate layer portion corresponding to a second memory cell 202a-2, 202b-2, etc.). The memory device 200a, 200b may further include a second channel structure 209a, 209b extending through the plurality of gate layer stacks 207a, 207b (e.g., through a gate layer portion corresponding to a third memory cell 202a-3, 202b-3, a gate layer portion corresponding to a fourth memory cell 202a-4, 202b-4, etc.).

In this regard it is noted that, in some aspects, within a gate layer stack 207a, 207b gate layer portions 208a, 208b corresponding to different memory cells 202a, 202b may be immediately adjacent to one another. Illustratively, gate layer portions 208a, 208b corresponding to different memory cells 202a, 202b may be part of the same continuous gate layer stack 207a, 207b. As an example, considering the configuration in FIG. 2B and FIG. 2C, the gate layer portion 208a, 208b corresponding to the first memory cell 202a-1 and the gate layer portion 208a, 208b corresponding to the third memory cell 202a-3 may be part of the same gate layer stack 207a, 207b and may be in contact with one another while being part of different memory cells. Further in this regard, a respective channel structure 209a, 209b (and respective channel portions 210a, 210b) may define the two memory cells 202a, 202b, e.g. the first memory cell 202a-1 and the third memory cell 202a-3. Considering the exemplary configuration in FIG. 2B and FIG. 2C, the memory device 200a, 200b may include a first channel structure 209a, 209b and a second channel structure 209a, 209b separated from one another along the first (lateral) direction 154. The first memory cell 202a-1, 202b-1 may be defined by a channel portion 210a, 210b of the first channel structure 209a, 209b and the other (third) memory cell 202a-3, 202b-3 may be defined by another (second) channel portion 210a, 210b of the second channel structure 209a, 209b.

As shown in FIG. 2B and FIG. 2C, the plurality of gate layer stacks 207a, 207b (and accordingly, the plurality of gate layer portions 208a, 208b) may be spaced from one another along the second (vertical) direction 154. As an example, a first gate layer stack and a second gate layer stack may be spaced from one another along the vertical direction, illustratively along a direction perpendicular to the substrate 230a, 230b.

Within a gate layer stack 207a, 207b the gate layer portions 208a, 208b into which the gate layer stack 207a, 207b is subdivided may be spaced from one another along the first (lateral) direction 152 (and along the third lateral direction 156, not shown) As an example, the first gate layer portion (of the first memory cell 202a-1, 202b-1) and the third gate layer portion (of the third memory cell 202a-3, 202b-3) may be spaced from one another along a direction parallel to the substrate 230a, 230b. The first gate layer portion and the third gate layer portion may be spaced from one another along the first (lateral) direction 152.

According to various aspects, as discussed in relation to FIG. 1A to FIG. 1C, a memory cell 202a, 202b may be divided into one or more (e.g., a plurality of) memory cells, by structuring the floating gate 206a, 206b into one or more (e.g., a plurality of) floating gates 206a, 206b. In this configuration, the gate layer portion 208a, 208b of a memory cell 202a, 202b may include a plurality of gate layer portions 208a, 208b disposed on both sides of the channel structure 209a, 209b that extends through them. Illustratively, considering the first channel structure 209a, 209b in FIG. 2A and FIG. 2B, a (first) gate layer portion (e.g., a first gate layer portion of the first memory cell 202a-1, 202b-1, e.g. of a first sub-cell) may be disposed at a first side of the channel structure 209a, 209b. Another (second) gate layer portion (e.g., a second gate layer portion of the first memory cell 202a-1, 202b-1, e.g. of a second sub-cell) may be disposed at a second side of the channel structure 209a, 209b. The first side of the of the channel structure 209a, 209b may be opposite the second side of the of the channel structure 209a, 209b. Stated in a different fashion, the (first) gate layer portion may face the first side (illustratively, a first side surface) of the channel structure 209a, 209b, and the other (second) gate layer portion may face the second side (illustratively, a second side surface) of the channel structure 209a, 209b. The memory cells 202a, 202b may thus be understood, in various aspects, as including two (or more) memory (sub-)cells, each with a respective floating gate 206a, 206b.

Stated in a different fashion, a (first) memory cell 202a, 202b may include a (first) floating gate 206a, 206b and a (first) channel portion 210a, 210b of a channel structure 209a, 209b. Another (second) memory cell 202a, 202b may include another (second) floating gate 206a, 206b and another (first) channel portion 210a, 210b of the same channel structure 209a, 209b. The memory cell 202a, 202b and the other memory cell 202a, 202b may be disposed at a same level within the memory device 200a, 200b. Illustratively, the gate layer portion of the memory cell 202a, 202b and the gate layer portion of the other memory cell 202a, 202b may correspond to the same gate layer stack 207a, 207b (e.g., may be formed from the same gate layer stack 207a, 207b). The memory cell 202a, 202b and the other memory cell 202a, 202b may thus be disposed at opposite sides of the same channel structure 209a, 209b (a first side and a second side opposite to one another), and may be disposed at a same vertical coordinate within the memory device 200a, 200b.

According to various aspects, in case the memory cells 202a, 202b are each divided into two (or more) memory (sub-)cells, the memory (sub-)cells (with the respective gate layer portion and floating gate) disposed at the first side of a channel structure 209a, 209b may correspond to a first column of memory cells 202a, 202b. The memory (sub-)cells (with the respective gate layer portion and floating gate) disposed at the second side of the channel structure 209a, 209b may correspond to a second (separate) column of memory cells 202a, 202b. Illustratively, in this configuration the gate layer portions 208a, 208b disposed at the first side may define a first string of memory (sub-)cells 202a, 202b and the gate layer portions 208a, 208b disposed at the second side may define a second string of memory (sub-) cells 202a, 202b. In case an electrical separation is provided between the sub-cells (e.g., a vertical cut along the center of the channel portion along the second direction 154), the first column of memory cells and the second column of memory cells may be independently addressable (e.g., for writing and/or reading).

In various aspects, the memory device 200a, 200b may include one or more gate separation layers 218a, 218b, e.g. one or more electrically insulating layers, disposed between gate layer stacks 207a, 207b (and accordingly, between gate layer portions 208a, 208b) that are adjacent to one another along the second (vertical) direction 154. Illustratively, a gate separation layer 218a, 218b may be disposed between a (first) gate layer stack and another (second) gate layer stack. The (first) gate layer stack may be disposed directly over the other (second) gate layer stack.

The one or more gate separation layers 218a, 218b may provide structural support to the memory device 200a, 200b, and may be formed during fabrication to provide boundaries for the formation of the spontaneously-polarizable portions. As an example, the one or more gate separation layers 218a, 218b may be formed in case the etching of cavities in which the spontaneously-polarizable portion is formed is very isotropic. Furthermore, the one or more gate separation layers 218a, 218b may provide electrical isolation between adjacent gate layer stacks 207a, 207 (and gate layer portions 208a, 208b), to prevent interferences among the memory cells 202a, 202b during writing and/or readout.

The one or more gate separation layers 218a, 218b may be or may include one or more electrically insulating layers. Illustratively, the one or more gate separation layers 218a, 218b may include (e.g., may consist of) an electrically insulating material. In various aspects, the one or more gate separation layers 218a, 218b may include (e.g., may consist of) a different electrically insulating material with respect to the gate electrode isolation 214a, 214b of at least one memory cell 202a, 202b (e.g., with respect to the gate electrode isolation 214a, 214b of each memory cell 202a, 202b). The one or more gate separation layers 218a, 218b may include (e.g., may consist of) an electrically insulating material having a different composition, different participating elements, different doping, and/or different stoichiometric relationship with respect to the electrically insulating material of the gate electrode isolation 214a, 214b of the at least one memory cell 202a, 202b. As an example, the one or more gate separation layers 218a, 218b may include (e.g., may consist of) an oxide, a nitride, or an oxynitride. For example, the one or more gate separation layers 218a, 218b may include silicon nitride.

According to various aspects, the channel structure(s) of the memory device 200a, 200b may be configured to provide a NAND architecture of the memory cells 202a, 202b. Illustratively, the plurality of memory cells 202a, 202b may be organized in sectors, and the memory cells 202a, 202b in a same sector may be corresponding to the same channel structure. A sector may include, for example, the memory cells 202a, 202b disposed in the same column of the memory device 200a, 200b. Illustratively, a sector may include the memory cells 202a, 202b stacked one over the other along the second direction 154.

Along a column, a channel structure 209a, 209b of the memory device 200a, 200b may illustratively include a plurality of channel portions 210a, 210b. Each channel portion 210a, 210b may correspond to a memory cell 200a, 200b, e.g. each portion may be the channel portion 210a, 210b of a memory cell 200a, 200b in that column. Stated in a different fashion, each portion may provide the channel region of the field-effect transistor structure of a memory cell 200a, 200b in that column. As an example, a (first) channel structure 209a, 209b may include a (first) channel portion corresponding to a (first) memory cell 202a-1, 202b-1, another (second) channel portion corresponding to a (second) memory cell 202a-2, 202b-2, etc. The (first) memory cell 202a-1, 202b-1 and the other (second) memory cell 202a-2, 202b-2 may be spaced from one another along the second direction 154.

In various aspects, a channel structure 209a, 209b of the memory device 200a, 200b may include one or more semiconductor portions that are corresponding to memory cells 202a, 202b in different columns. Each semiconductor portion may correspond to a column (illustratively, a sector) of memory cells 202a, 202b (illustratively, a column of memory sub-cells). Illustratively, a channel structure 209a, 209b may be formed in a recess extending through the plurality of gate layer stacks 207a, 207b, and within the recess the channel structure 209a, 209b may include one or more semiconductor portions that are configured (e.g., disposed) in such a way that each semiconductor portion defines the channel portions 210a, 210b of memory cells 202a, 202b stacked one over the other along the second direction 154.

With reference for example to the exemplary configuration in FIG. 2B and FIG. 2C, a (first) channel structure 209a, 209b may include at least two semiconductor portions, e.g. a first semiconductor portion 222a-1, 222b-1, and a second semiconductor portion 222a-2, 222b-2. The first semiconductor portion 222a-1, 222b-1 may correspond to a first sector of memory (sub-)cells 202a, 202b, e.g. to memory cells 202a, 202b disposed along a (same) first column (stacked one over the other along the second direction 154). The second semiconductor portion 222a-2, 222b-2 may correspond to a second sector of memory (sub-)cells 202a, 202b, e.g. to memory cells 202a, 202b disposed along a (same) second column (stacked one over the other along the second direction 154). Thus, a channel structure 209a, 209b of the memory device 200a, 200b may be formed in a way that allows forming a plurality of sectors of memory cells in an efficient manner (see also FIG. 3A to FIG. 4G).

According to various aspects, a separation portion 224a, 224b may be disposed between the semiconductor portions of a channel structure 209a, 209b, e.g. between the first semiconductor portion 222a-1, 222b-1 and the second semiconductor portion 222a-2, 222b-2 of the first channel structure in FIG. 2B and FIG. 2C. The separation portion 224a, 224b may be configured to provide electrical isolation between the semiconductor portions of the channel structure 209a, 209b. Illustratively, the separation portion 224a, 224b may be an electrically insulating portion disposed between the (at least two) semiconductor portions. As an example, the separation portion 224a, 224b may include an air gap between the semiconductor portions, e.g. between the first semiconductor portion 222a-1, 222b-1 and the second semiconductor portion 222a-2, 222b-2 (illustratively, the NAND string may be of "macaroni"-type). As another example, the separation portion 224a, 224b may include a (solid) electrically insulating material (illustratively, may be at least partially filled with an electrically insulating material) such as an oxide, a nitride, or an oxynitride. As an example, the separation portion 224a, 224b may include (e.g., may consist of) silicon dioxide.

According to various aspects, the plurality of gate layer stacks 207a, 207b and the channel structure(s) 209a, 209b may be arranged to form the plurality of (field-effect transistor based) memory cells 202a, 202b. Illustratively, the plurality of gate layer stacks 207a, 207b and the channel structure(s) 209a, 209b may be configured to define a plurality of field-effect transistor structures, and to define accordingly the plurality of memory cells 202a, 202b. As discussed above, each memory cell 202a, 202b may include a respective gate layer portion 208a, 208b of a gate layer stack 207a, 207b and a respective channel portion 210a, 210b of a channel structure 209a, 209b. As discussed in relation to FIG. 1A and FIG. 1B, the spontaneously-polarizable portion 204a, 204b and the floating gate 206a, 206b of a memory cell 202a, 202b may be disposed between the (respective) gate layer portion 208a, 208b (the respective gate electrode layer 212a, 212b) and the (respective) channel portion 210a, 210b.

As discussed in relation to FIG. 1A and FIG. 1B, in a memory cell 202a, 202b the gate layer portion 208a, 208b (illustratively, the gate electrode layer 212a, 212b), the floating gate 206a, 206b, the channel-isolation portion 216a, 216b, and the channel portion 210a, 210b may provide (e.g., define, or form) a field-effect transistor structure. In the exemplary configuration in FIG. 1A and FIG. 1B, the (first) gate layer portion, the (first) floating gate, the (first) channel-isolation portion, and the (first) channel portion of the first memory cell 202a-1, 202b-1 may provide a first field-effect transistor structure. The (second) gate layer portion, the (second) floating gate, the (second) channel-isolation portion, and the (second) channel portion of the second memory cell 202a-2, 202b-2 may provide a second field-effect transistor structure, etc.

As shown in FIG. 2B and FIG. 2C (see also FIG. 2D and FIG. 2E), a channel-isolation structure 215a, 215b may at least partially surround a sidewall of a channel structure 209a, 209b. Illustratively, the memory device 200a, 200b may include one or more channel isolation structures 215a, 215b disposed (respectively) in the one or more channel structures 209a, 209b. In various aspects, a channel-isolation structure 215a, 215b may completely surround the sidewall of a respective channel structure 209a, 209b. Illustratively, a channel-isolation structure 215a, 215b may at least partially surround the semiconductor portion(s) of the respective channel structure 209a, 209b. In the exemplary configuration in FIG. 2B and FIG. 2C, a (first) channel-isolation structure 215a, 215b may at least partially surround a sidewall of the first channel structure 209a, 209b, e.g. may at least partially surround the (first and second) semiconductor portions of the first channel structure 209a, 209b. Another (second) channel-isolation structure 215a, 215b may at least partially surround a sidewall of the second channel structure 209a, 209b, e.g. may at least partially surround the (first and second) semiconductor portions of the second channel structure 209a, 209b.

The one or more channel-isolation structures 215a, 215b may extend through the plurality of gate layer stacks 207a, 207b. The channel-isolation structure(s) 216a, 216b may be formed in the recess into which the channel structure 209a, 209b is (subsequently) formed (see also FIG. 3A to FIG. 4G). A channel-isolation structure 215a, 215b of the plurality of channel-isolation structures 215a, 215b may include a plurality of channel-isolation portions 216a, 216b wherein each c channel-isolation portion 216a, 216b corresponds to a respective memory cell 202a, 202b (or memory sub-cell). Illustratively, a channel-isolation structure 215a, 215b may be subdivided into a plurality of channel-isolation portions 216a, 216b, and each memory cell 202a, 202b may include a respective channel-isolation portion 216a, 216b of the plurality of channel-isolation portions 216a, 216b. A channel-isolation structure 215a, 215b may be formed as a continuous structure (see also FIG. 3A to FIG. 4G), and may be logically and/or structurally subdivided into a plurality of portions corresponding to the memory cells 202a, 202b (or memory sub-cells) of the memory device 200a, 200b. It is understood that the aspects discussed in relation to a channel-isolation portion (e.g., in terms of materials, disposition, etc.) may apply in a corresponding manner to a channel-isolation structure, and vice versa. As discussed in relation to FIG. 1A and FIG. 1B, the channel-isolation portion 216a, 216b of a memory cell 202a, 202b may be disposed between the respective channel portion 210a, 210b (around which the channel-isolation portion 216a, 216b is formed) and the floating gate(s) 206a, 206b of the memory cell 202a, 202b. Illustratively, a channel-isolation structure 215a, 215b may be disposed between the channel structure 209a, 209b around which the channel-isolation structure 215a, 215b is formed and the floating gates 206a, 206b of the memory cells 202a, 202b corresponding to that channel structure 209a, 209b (illustratively, the memory cells 202a, 202b disposed in that column(s)).

Figure 2D:
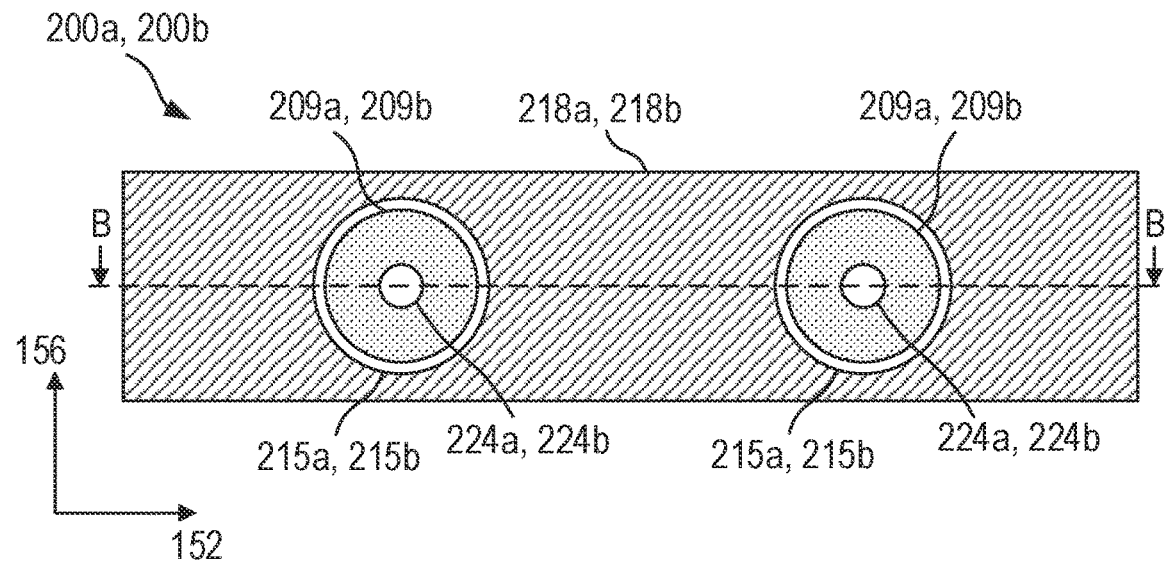
FIG. 2D and FIG. 2E show a schematic top view of a memory device according to various aspects.
Figure 2E:
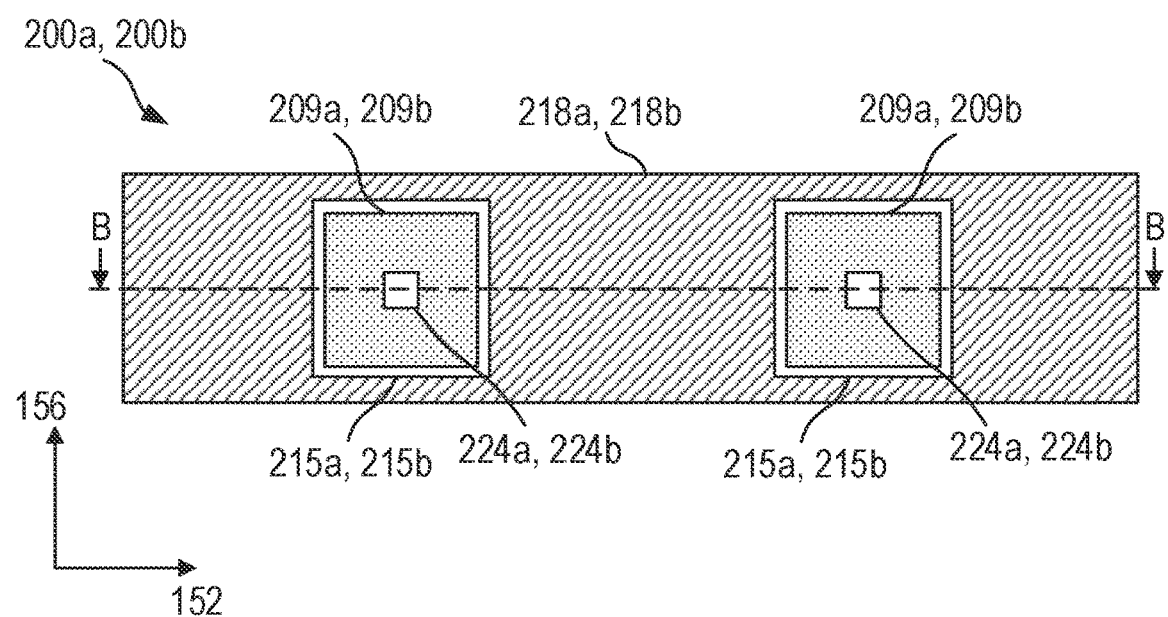

FIG. 2D and FIG. 2E show a top view of the memory device 200a, 200b in a schematic representation, according to various aspects. The top view in FIG. 2D and FIG. 2E illustrate an exemplary configuration of the channel portion(s) of the memory device 200a, 200b. The exemplary configuration in FIG. 2D and FIG. 2E may be applicable to the memory device 200a described in relation to FIG. 2B and/or to the memory device 200b described in relation to FIG. 2C. The top view in FIG. 2D and FIG. 2E illustrate the memory device as seen along the line B-B shown in FIG. 2B and FIG. 2C.

In FIG. 2D and FIG. 2E two possible configurations for the shape of a channel structure 209a, 209b (and overall for the shape of the memory cells 202a, 202b) are illustrated. These two configurations have been found to allow a reliable and reproducible fabrication process for fabricating the memory device 200a, 200b, as discussed in relation to FIG. 1C. It is however understood that also other configurations (e.g., other geometries) of the channel structures 209a, 209b may be provided (e.g., rectangular or triangular, as other examples).

As an example, as shown in FIG. 2D, the channel structure(s) 209a, 209b of the memory device 200a, 200b may have a circular shape in plan view. Illustratively, the channel structure(s) 209a, 209b may have a circular shape when seen from the second (vertical) direction 154. Stated in a different fashion, the channel structure(s) 209a, 209b may have a circular cross section when cut along a plane parallel to the substrate 230a, 230b. As another example, as shown in FIG. 2E, the channel structure(s) 209a, 209b of the memory device 200a, 200b may have a square shape in plan view. Illustratively, the channel structure(s) 209a, 209b may have a square shape when seen from the second (vertical) direction 154. Stated in a different fashion, the channel structure(s) 209a, 209b may have a square cross section when cut along a plane parallel to the substrate 230a, 230b.

Figure 3A:
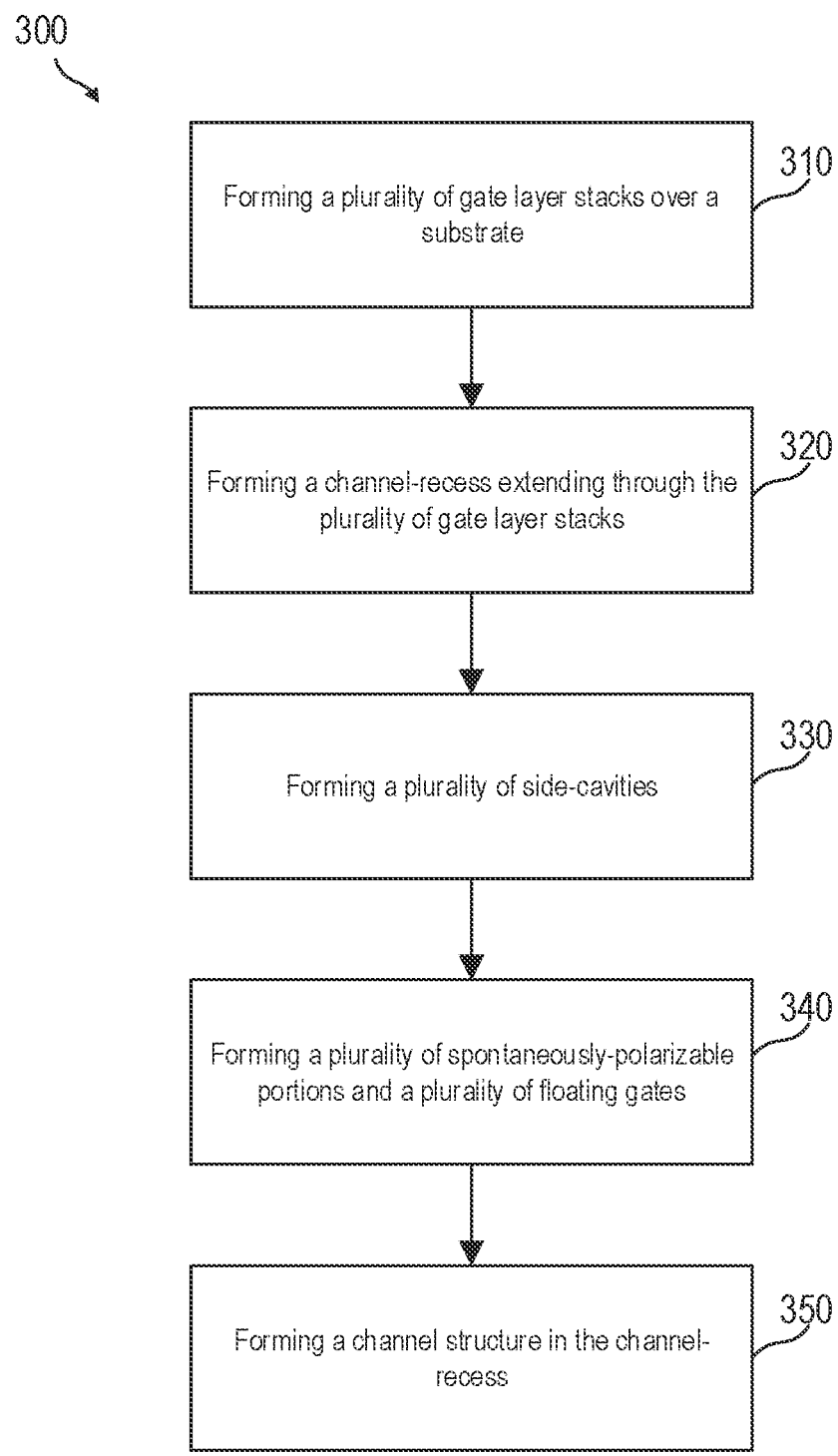
FIG. 3A shows a schematic flow diagram of a method of forming a memory device according to various aspects.

FIG. 3A shows a schematic flow diagram of a method 300 of forming a memory device (e.g., the memory device 200, 200a described in relation to FIG. 2A to FIG. 2E) according to various aspects. The method 300 may be configured to provide a three-dimensional stacked memory device (e.g., a memory device with a 3D-NAND architecture). The method 300 may be configured to provide a memory device including a plurality of field-effect transistor-based memory cells with a spontaneously-polarizable portion and a floating gate. Illustratively, the method 300 may provide integrating a memory cell 100a as described in relation to FIG. 1A into a three-dimensional stacked memory device. Various aspects of a method of fabricating a memory device (e.g., various aspects of the method 300) are further illustrated in FIG. 3B to FIG. 3H.

Figure 3B:
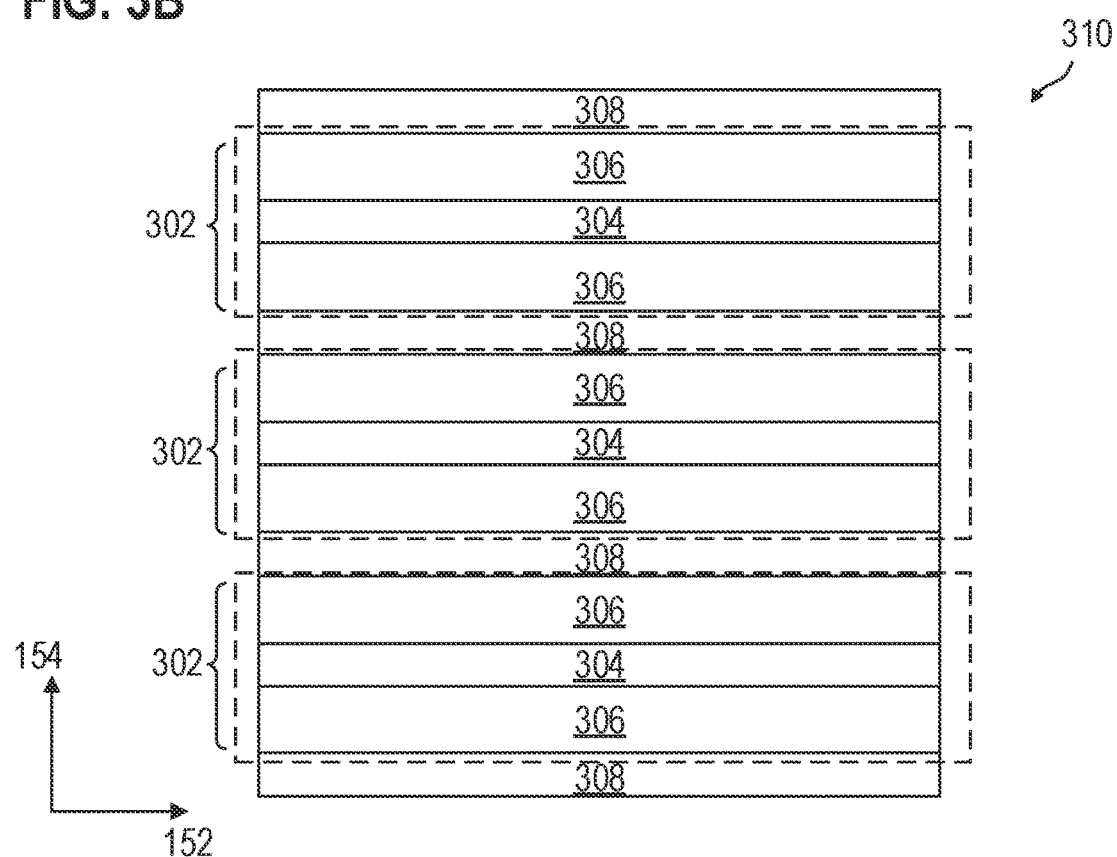
FIG. 3B to FIG. 3H illustrate schematically various aspects of a method of forming a memory device.

The method 300 may include, in 310, forming a plurality of gate layer stacks 302 over a (planar) substrate (see FIG. 3B). The substrate (not shown) may be configured, for example, as the substrate 118a, 118b, 230a, 230b described in relation to FIG. 1A to FIG. 2E, e.g. the substrate may be a semiconductor substrate, such as a silicon wafer. Forming the plurality of gate layer stacks 302 may include forming one or more electrically insulating layers 306 and forming one or more gate electrode layers 304. The one or more electrically insulating layers 306 and the one or more gate electrode layers 304 may be configured as the electrically insulating layers 110a, 110b, 214a, 214b and the gate electrode layers 108a, 108b, 212a, 212b described in relation to FIG. 1A to FIG. 2E. Illustratively, each gate layer stack 302 may include a gate electrode layer 304 and one or more electrically insulating layers 306.

The expressions "forming a layer" or "forming a portion" may be used herein to describe the fabrication of a layer or portion (e.g., in a memory device) according to techniques known in the art. As an example, "forming a layer" or "forming a portion" may include depositing a material (e.g., over a substrate, or over an already formed layer or portion). A deposition of material may be carried out by means of any suitable technique, such as sputtering, physical vapor deposition (PVD), chemical vapor deposition (CVD), atomic layer deposition (ALD), electron-beam evaporation, thermal vapor deposition, and the like. As another example, "forming a layer" or "forming a portion" may include growing that layer or portion. Illustratively, "forming a layer" or "forming a portion" may include inducing a crystal growth from a seed layer or seed portion, e.g. via a nucleation process. In some aspects, the deposition or the growth of a layer or portion may be carried out in a vacuum chamber.

In some aspects, a mask may be used. A mask may include a material that serves for transferring a photo-lithography mask pattern into one or more material layers or portions. A mask may include, for example, a positive or negative photo resist (also referred to as soft mask) or a hard mask (e.g., a hard mask layer). The photo resist itself may be patterned by standard lithography processes. The patterning of the hard mask material may include a combination of photo resist patterning followed by etch of the hard mask material (e.g., wet or dry chemical etching). However, any other suitable process may be used to transfer a desired pattern into one or more material layers or portions. The patterning may include depositing a photo resist, and carrying out a lithography process (e.g., a photolithography process) including a photo resist development and a hard mask etch to obtain a desired pattern for a layer or for a portion.

As an example, forming a plurality of gate layer stacks 302 may include: forming a first electrically insulating layer 306; forming a first gate electrode layer 304 on the first electrically insulating layer 306 (e.g., forming a layer of electrically conductive material on the first electrically insulating layer 306); and forming a second electrically insulating layer 306 on the first gate electrode layer 304. Such steps may be repeated depending on a desired number of gate layer stacks 302. Illustratively, the method 300 may further include forming a third electrically insulating layer 306, a second gate electrode layer 304 on the third electrically insulating layer 306, and a fourth electrically insulating layer 306 on the second gate electrode layer 304, etc.

Forming the one or more gate electrode layers 304 may include forming one or more electrically conductive layers, e.g. one or more layers including (e.g., consisting of) an electrically conductive material. In some aspects, each electrically conductive layer may be disposed between at least two electrically insulating layers 306. Illustratively, each gate electrode layer 304 may be in direct physical contact with at least two electrically insulating layers 306 (an electrically insulating layer disposed under the gate electrode layer and another electrically insulating layer disposed on the gate electrode layer).

According to various aspects, as shown in FIG. 3B, the method 300 may further include forming one or more gate separation layers 308, e.g. forming a plurality of gate separation layers 308, e.g. one or more (further) electrically insulating layers. The gate separation layer(s) 308 may be configured as the gate separation layers 218a, 218b described in relation to FIG. 2B and FIG. 2C. A (e.g., each) gate separation layer may be disposed between two adjacent gate layer stacks 302. The method 300 may include forming a gate separation layer 308 between two gate layer stacks 302 that are adjacent to one another along the vertical direction 154 (e.g., two gate layer stacks 302 that are adjacent to one another along a direction perpendicular to the substrate). Illustratively, forming the plurality of gate layer stacks, 310, may include forming a gate separation layer 308 after forming a (first) gate layer stack 302 and prior to forming another (second) gate layer stack 302.

The method 300 may illustratively include forming a gate separation layer 308 after forming the second electrically insulating layer of a gate layer stack 302, and prior to forming the first electrically insulating layer of the next gate layer stack 302. As an example, forming the plurality of gate layer stacks, 310, may include forming a gate separation layer 308 (e.g., over the substrate); forming an electrically insulating layer 306 on the gate separation layer 308; forming an electrically conductive layer 304 on the electrically insulating layer 306; forming another electrically insulating layer 306 on the electrically conductive layer 304; and forming another gate separation layer 308 on the other electrically insulating layer 306. Such steps may be repeated to provide a desired number of gate layer stacks 302 for the memory device 200, 200a. In this way a layer stack may be provided. According to various aspects, the one or more gate separation layers 308 may include (e.g., may consist of) a different electrically insulating material with respect to the one or more electrically insulating layers 306 of the gate layer stacks 302.

Figure 3C:
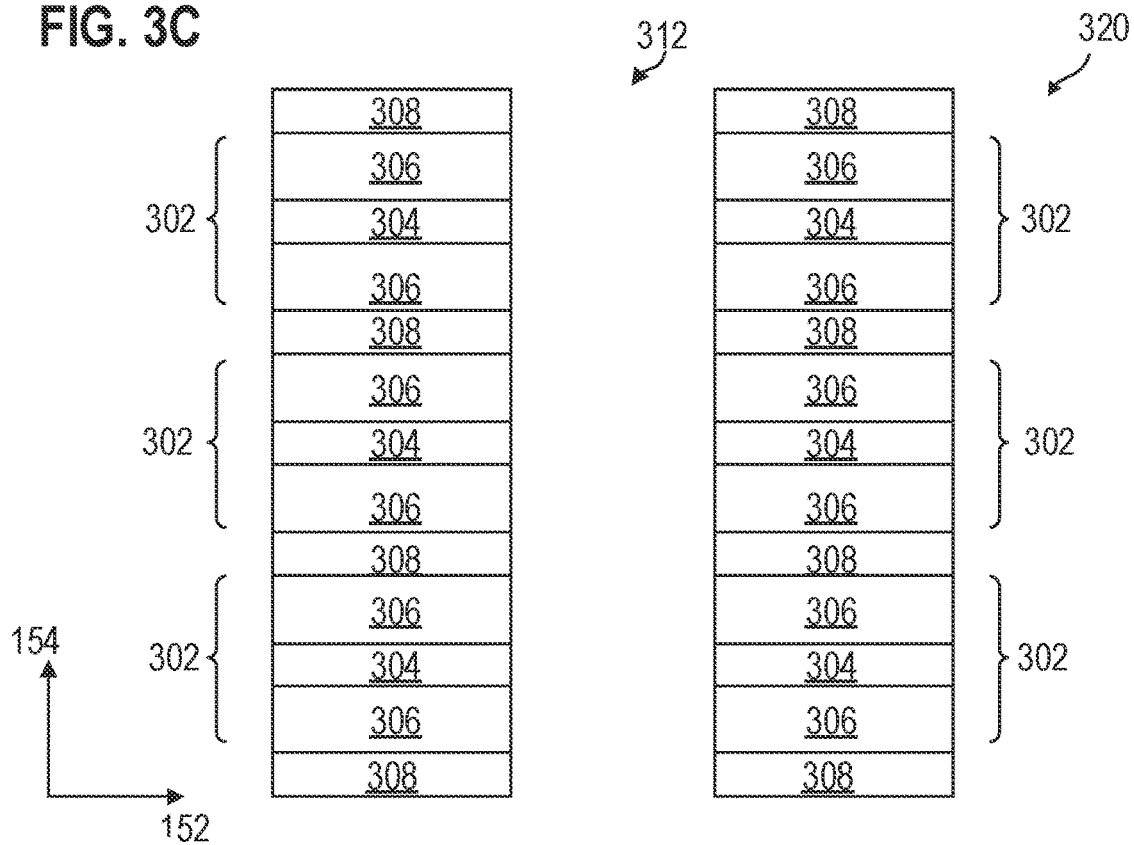
Figure 3D:
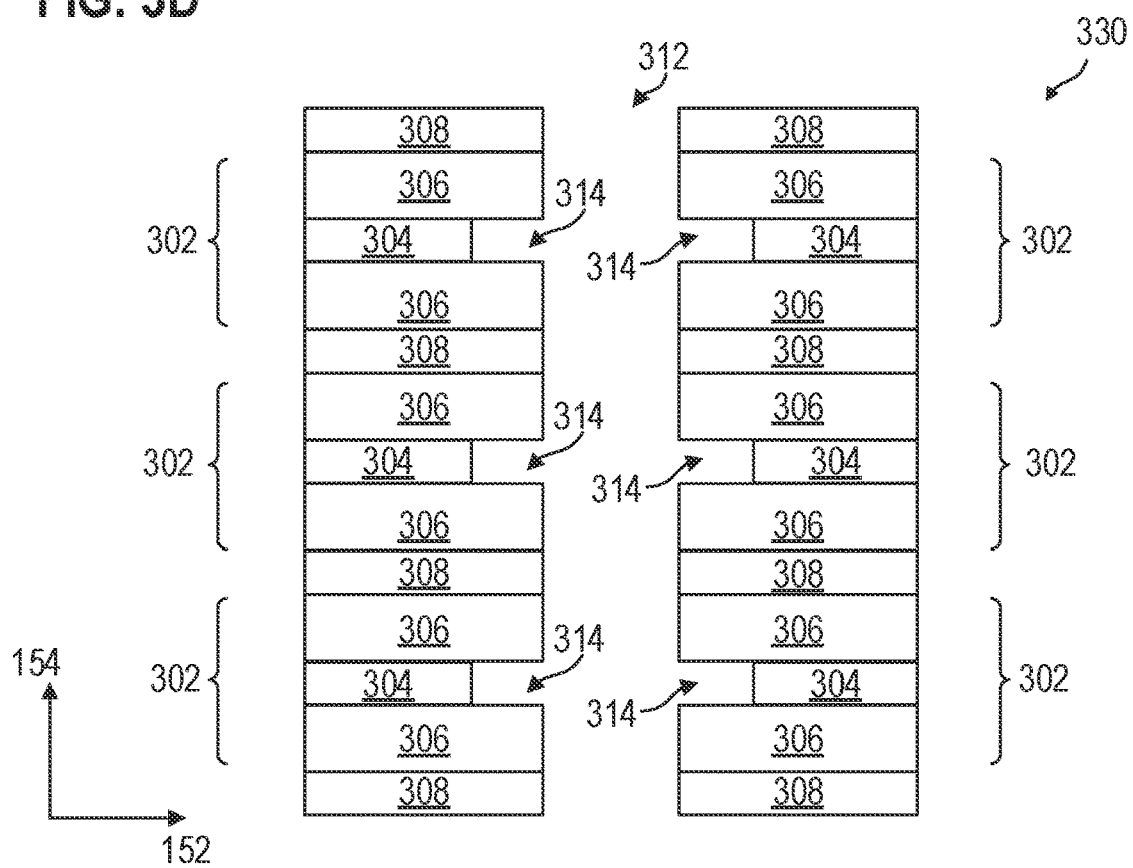
Figure 3E:
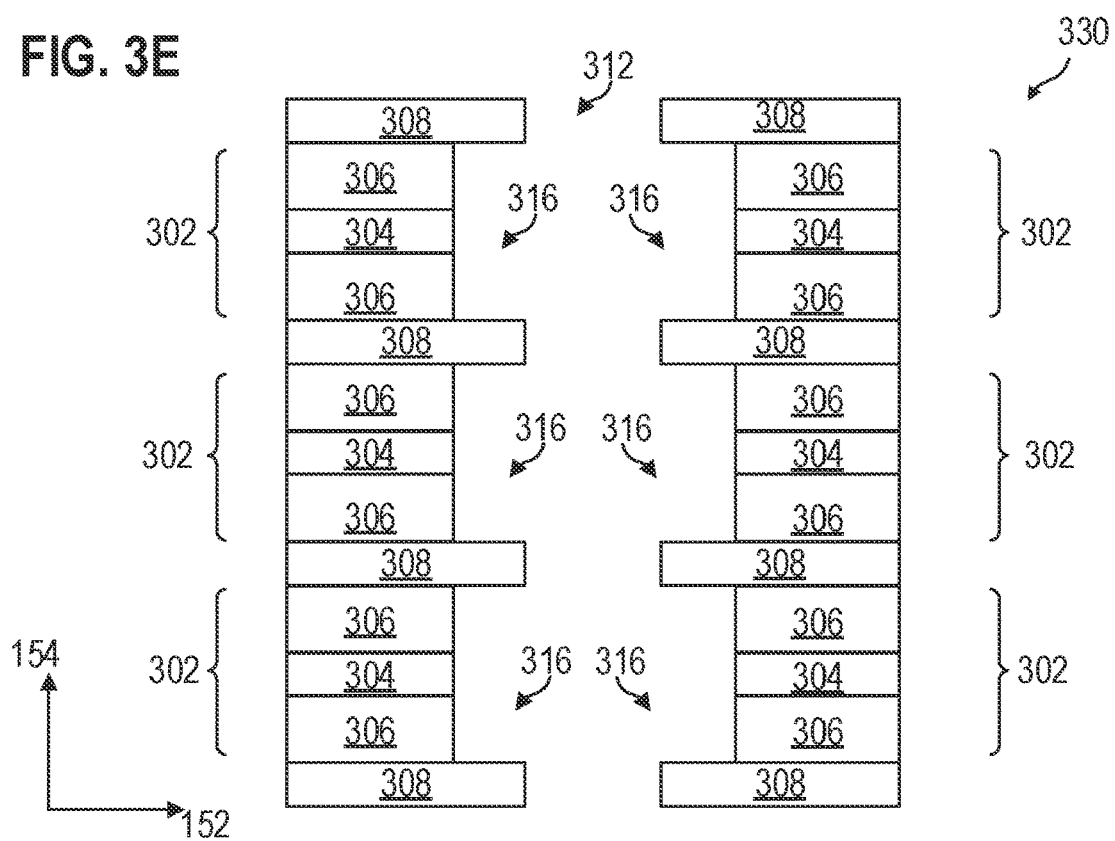

The method 300 may further include, in 320, forming a channel-recess 312 extending through the plurality of gate layer stacks 302 (see FIG. 3C). Illustratively, after deposition of the layer stack, a hole may be formed (e.g., etched) into the layer stack to provide the channel-recess 312. It is understood that the method 300 may include forming any suitable number of channel-recesses 312, e.g. the method 300 may include forming one or more channel-recesses 312, e.g. a plurality of channel-recesses 312, extending through the plurality of gate layer stacks 302. In various aspects, forming the channel-recess(es) 312 may include removing a material of the gate layer stacks 302 (e.g., via etching) to expose the substrate in at least a recess 312 extending through the plurality of gate layer stacks 302 (e.g., in a plurality of recesses 312 extending through the plurality of gate layer stacks 302). A channel-recess 312 may also be referred to herein as channel-pit.

Forming a channel-recess 312 may include, for example, creating a mask pattern over the plurality of gate layer stacks 302 (e.g., over the uppermost layer of the layer stack, for example the uppermost gate separation layer 308). The mask pattern may have openings in correspondence of the locations where a channel-recess 312 is to be formed. The mask pattern may be created, for example, via photolithography, and may be removed after forming the channel-recess(es) 312.

As an example, forming a channel-recess 312 extending through the plurality of gate layer stacks 302 may include etching the plurality of gate layer stacks 302 (and, if present, the gate separation layers 308). The etching may be carried out in a vertical direction, e.g. in a direction perpendicular to the substrate (e.g., may be carried out to etch the plurality of gate layer stacks 302 along the second direction 154 described in relation to FIG. 1A to FIG. 2E). The etching may include, for example, reactive-ion etching, RIE, which may provide a reproducible and efficient etching of the gate layer stacks 302. It is however understood that any suitable technique (e.g., any suitable etching process) may be used to form a channel-recess 312 in the plurality of gate layer stacks 302.

In some aspects, after a channel-recess 312 is formed, there may be a first plurality of gate layer portions of the gate layer stacks 302 disposed at a first side of the channel-recess 312, and a second plurality of gate layer portions of the gate layer stacks 302 disposed at a second side of the channel-recess 312, as shown in FIG. 3C. For example, the first plurality of gate layer portions may form (e.g., may correspond to) a first sector of memory (sub-)cells, and the second plurality of gate layer portions may form (e.g., may correspond to) a second sector of memory (sub-)cells.

The method 300 may further include, in 330, forming a plurality of side-cavities 316 (see FIG. 3D and FIG. 3E), e.g. by means of highly selective etching. The method 300 may include creating a plurality of side-cavities 316 to accommodate the floating gates of the memory cells, and to accommodate the spontaneously-polarizable portions of the memory cells (described in further detail below in relation to FIG. 3F). Illustratively, the method 300 may include removing part of the material of the gate layer stacks 302 to create a plurality of side-cavities 316.

A (e.g., each) side-cavity 316 may be disposed between a (respective) gate layer portion of the plurality of gate layer portions and the (respective) channel-recess 312. Illustratively, a side-cavity 316 may be a side-recess extending in a gate layer portion in a lateral direction parallel to the substrate (e.g., extending from the channel-recess 312 towards the inside of the gate layer portion).

Forming the plurality of side-cavities 316 may include, for example, selectively etching the plurality of gate layer stacks 302 in a lateral direction parallel to the substrate (e.g., etching along the first direction 152 described in relation to FIG. 1A to FIG. 2E). The selective etching may be carried out within each channel-recess 312 to form a plurality of side-cavities 316 within that channel-recess 312. In this regard, the method 300 may include forming the plurality of side-cavities 316 after the channel-recess 312 have been formed.

In some aspects, the selective etching to form the plurality of side-cavities 316 may include a plurality of selective etching steps. Illustratively, the method 300 may include a first selective etching to etch the plurality of electrically conductive layers 304 to form a plurality of partial side-cavities 314 (see FIG. 3D) and, subsequently, a second selective etching to etch the plurality of electrically insulating layers 306 to form the side-cavities 316 (or vice versa). Illustratively, a first etching may be configured to be selective for the electrically conductive material of the gate electrode layers 304, leaving unetched the material of the one or more electrically insulating layers 306 of the gate layer stacks 302 (and leaving unetched the material of the gate separation portions 308). A second etching may be configured to be selective for the material of one or more electrically insulating layers 306 of the gate layer stacks 302, so that the gate electrode layers 304 (and the gate separation portions 308) are not etched in this etching process. In some aspects, the gate separation portions 308 may remain unetched and may define the plurality of side-cavities 316.

Carrying out the selective etching in a plurality of subsequent steps ensures a higher degree of control over the formation of the side-cavities 316.

Figure 3F:
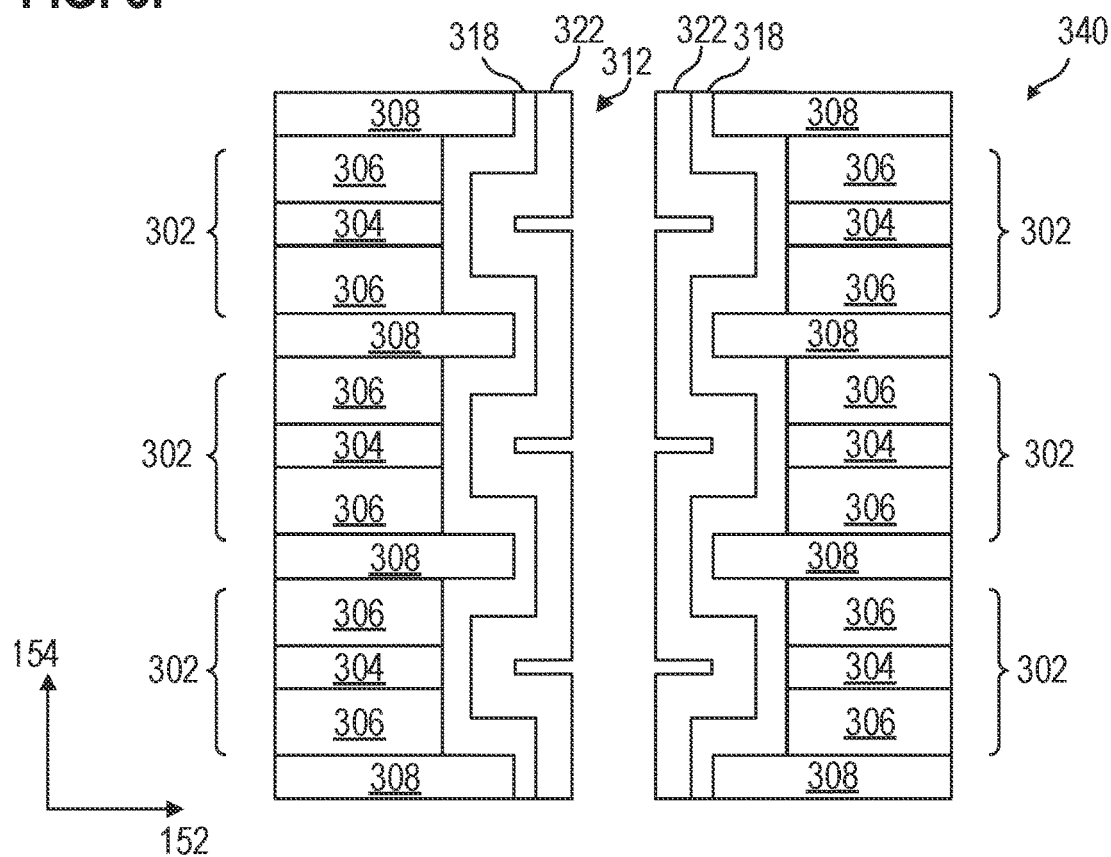
Figure 3G:
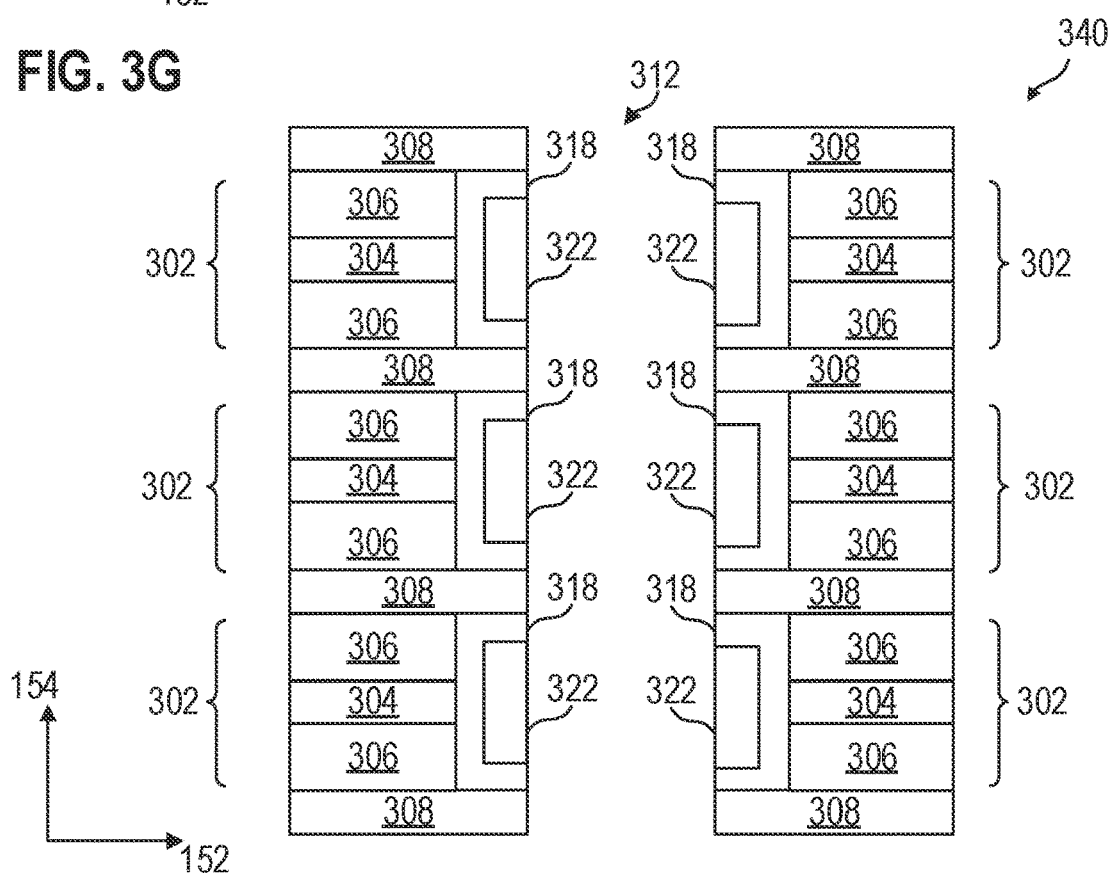

The method 300 may further include, in 340, forming a plurality of spontaneously-polarizable portions 318 and a plurality of floating gates 322 in the formed side-cavities 316 (see FIG. 3F and FIG. 3G). Illustratively, a spontaneously-polarizable portion 318 and a floating gate 322 may be disposed in a side-cavity 316 of the plurality of side-cavities 316. Each spontaneously-polarizable portion 318 and each floating gate 322 may be disposed in a respective side-cavity 316 of the plurality of side-cavities 316.

Forming the plurality of spontaneously-polarizable portions 318 may include depositing a spontaneously-polarizable material (e.g., ferroelectric hafnium oxide) in the plurality of side-cavities 316, e.g. by means of conformal deposition (such as atomic layer deposition). Illustratively, forming the plurality of spontaneously-polarizable portions 318 may include conformally depositing a layer of spontaneously-polarizable material in the plurality of side-cavities 316.

Forming the plurality of floating gates 322 may include depositing an electrically conductive material (such as a metal, a degenerate semiconductor, and/or the like) in the plurality of side-cavities 316. Forming the plurality of floating gates 322 may be carried out after forming the plurality of spontaneously-polarizable portions 318, so that the plurality of floating gates 322 may be formed (e.g., deposited) on the plurality of spontaneously-polarizable portions 318. Forming the plurality of floating gates 322 may include conformally depositing a layer of electrically conductive material in the plurality of side-cavities 316, e.g. by means of conformal deposition (such as atomic layer deposition).

According to various aspects, the method 300 may further include partially removing the spontaneously-polarizable material of the formed spontaneously-polarizable portions 318 and partially removing the electrically conductive material of the formed floating gates 322 in such a way that the channel-recess(es) 312 is/are free of the spontaneously-polarizable material and free of the electrically conductive material (see FIG. 3G). Illustratively, the method 300 may further include removing any excess material of the spontaneously-polarizable portions 318 and the floating gates 322 from the channel-recess(es) 312. As an example, the method 300 may include etching (e.g., selectively etching) the spontaneously-polarizable material of the formed spontaneously-polarizable portions 318 and etching the electrically conductive material of the formed floating gates 322 within the channel-recess(es) 312. The etching may be carried out in a vertical direction, e.g. may be carried out along the extension of the channel-recess(es) 312.

Figure 3H:
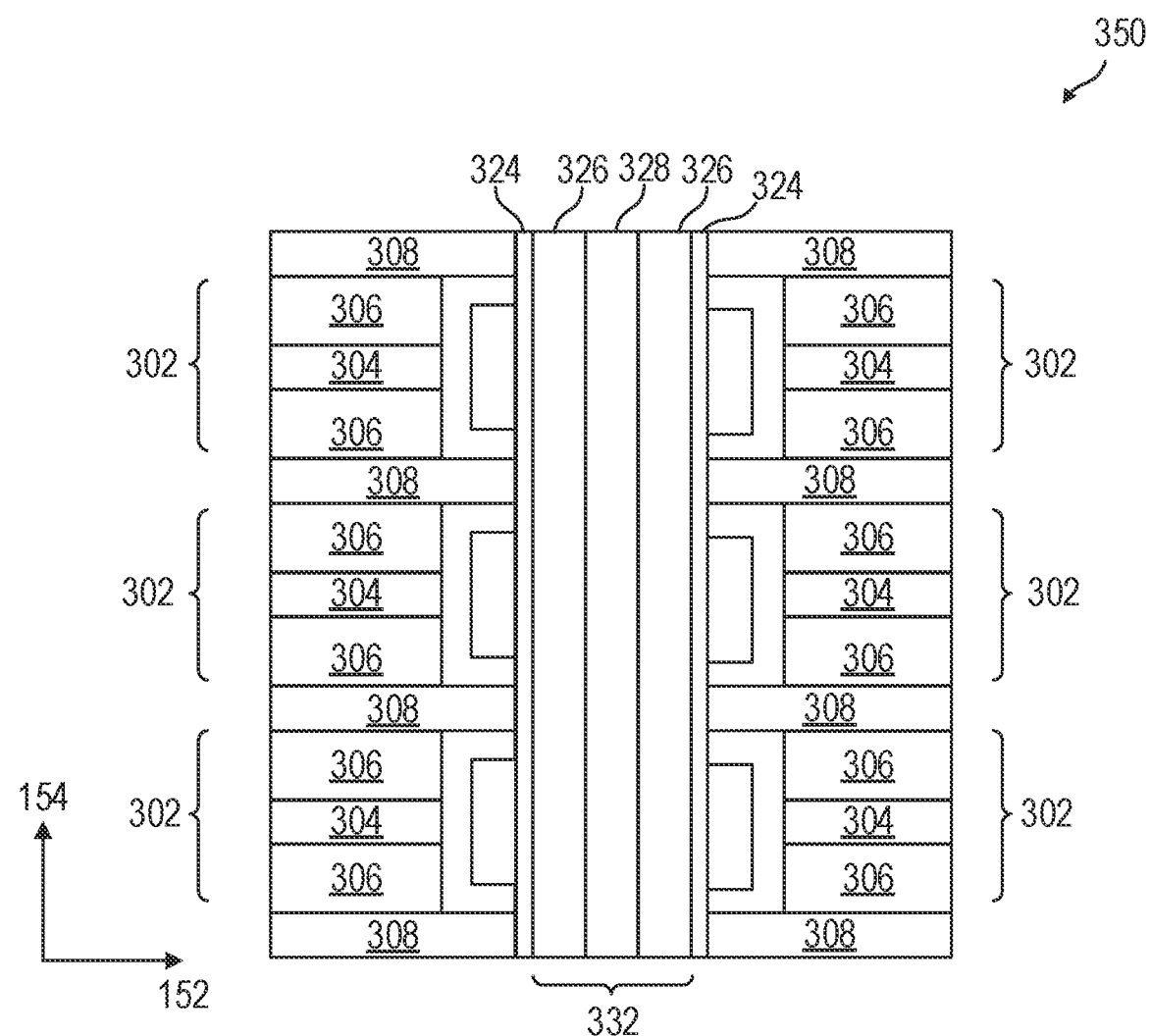

The method 300 may further include, in 350, forming a channel structure 332 in the channel-recess 312 (e.g., the method 300 may include forming a respective channel structure 332 in each channel-recess 312), see FIG. 3H. Forming a channel structure 332 in a channel-recess 312 may include forming one or more semiconductor portions 326 in the channel-recess 312. As an example, forming the channel structure 332 may include: depositing a semiconductor material to form one or more semiconductor portions 326; and providing doped regions in the one or more semiconductor portions 326 to form source/drain regions (e.g., n-doping and p-doping regions of the silicon portion). The doped regions may correspond to the source/drain regions of the field-effect transistor structures of the memory cells of the memory device.

According to various aspects, forming the channel structure 332 in the channel-recess 312 may further include forming a channel-isolation structure 324 laterally surrounding the channel-recess 312, e.g. the method 300 may include forming one or more (e.g., a plurality of) channel-isolation structures 324. Illustratively, the method 300 may include forming a channel-isolation structure 324 in each channel-recess 312. The channel-isolation structure(s) 324 may be formed prior to forming the one or more semiconductor portions 326. The channel isolation structure(s) 324 may be formed between the floating gates 322 and the semiconductor portions 326 of the channel structure 312. As an example, the method 300 may include conformally depositing an electrically insulating material to cover a sidewall of the channel-recess 312 to form the channel-isolation structure(s) 324.

According to various aspects, forming the channel structure 332 in the channel-recess 312 may further include forming a separation portion 328 in the channel-recess 312. The separation portion 328 may be formed between two semiconductor portions 326 of a channel structure 332, e.g. the separation portion 328 may be an electrically insulating portion disposed between a first semiconductor portion 326 of the channel structure 332 and a second semiconductor portion 326 of the channel structure 332. As an example, forming the separation portion 328 may include forming (or leaving) an air gap in the channel structure 332, e.g. an air gap between a first semiconductor portion 326 of the channel structure 332 and a second semiconductor portion 326 of the channel structure 332. As another example, forming the separation portion 328 may include depositing an electrically insulating material (e.g., an oxide, a nitride, or an oxynitride) in the channel-recess 312, e.g. in a gap between a first semiconductor portion 326 of the channel structure 332 and a second semiconductor portion 326 of the channel structure 332.

According to various aspects, the method 300 may further include sub-dividing the floating gate 322 of a memory cell into one or more floating gates, so that a memory cell may be divided into one or more memory sub-cells. As an example, the method 300 may include performing a cut along the center of the channel structure 332 along the vertical direction to separate the memory cells into two (or more) parts, e.g. into two (or more) sub-cells. As another example, the method 300 may further include forming electrically insulating portions between the floating gates of the sub-cells in which a memory cell is divided into.

Figure 4A:
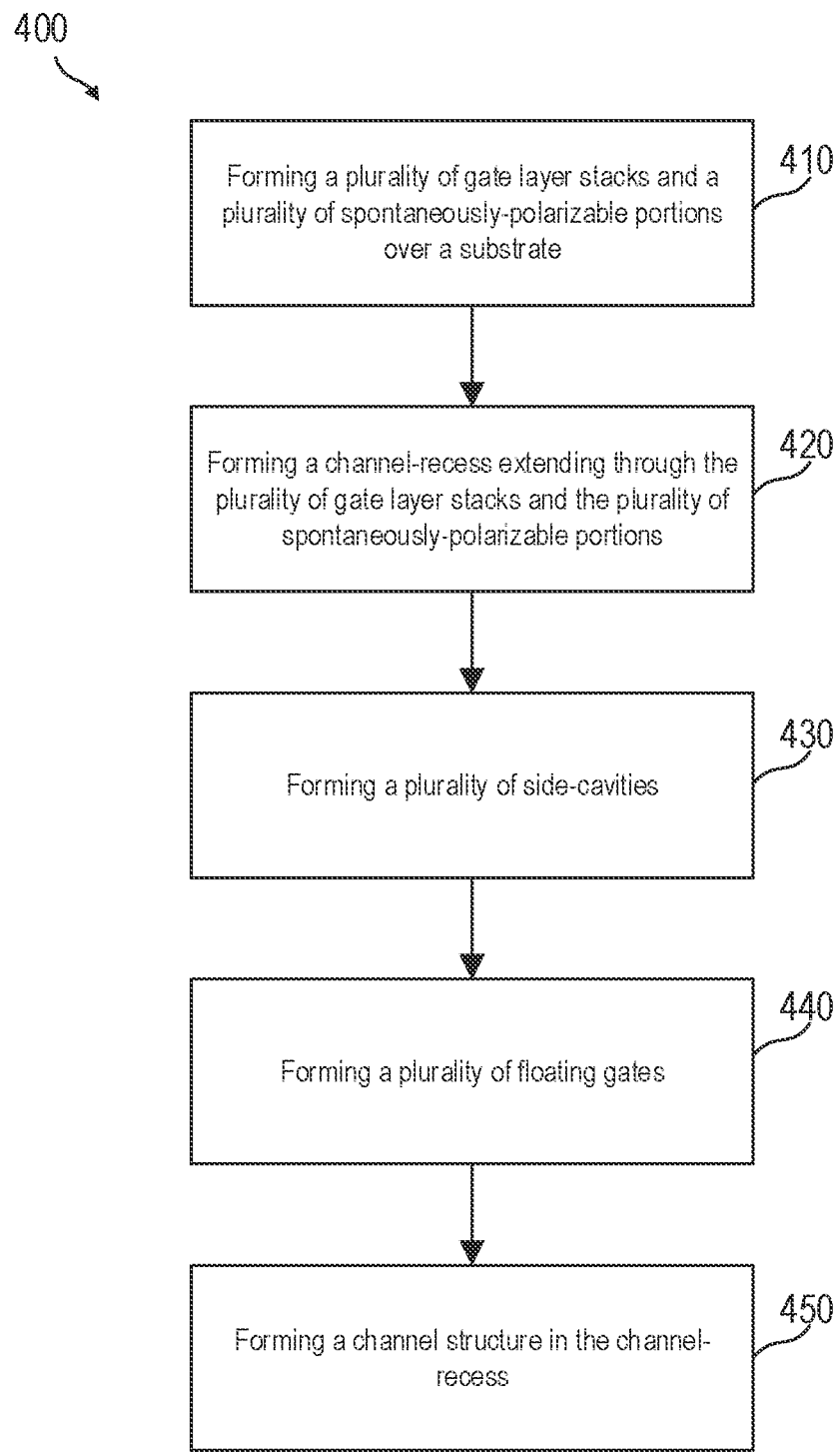
FIG. 4A shows a schematic flow diagram of a method of forming a memory device according to various aspects.

FIG. 4A shows a schematic flow diagram of a method 400 of forming a memory device (e.g., the memory device 200, 200b described in relation to FIG. 2A to FIG. 2E) according to various aspects. The method 400 may be configured to provide a three-dimensional stacked memory device (e.g., a memory device with a 3D-NAND architecture). The method 400 may be configured to provide a memory device including a plurality of field effect transistor based memory cells with a spontaneously polarizable portion and a floating gate. Illustratively, the method 400 may provide integrating a memory cell 100b as described in relation to FIG. 1B into a three-dimensional stacked memory device. Various aspects of a method of fabricating a memory device (e.g., various aspects of the method 400) are further illustrated in FIG. 4B to FIG. 4G.

Figure 4B:
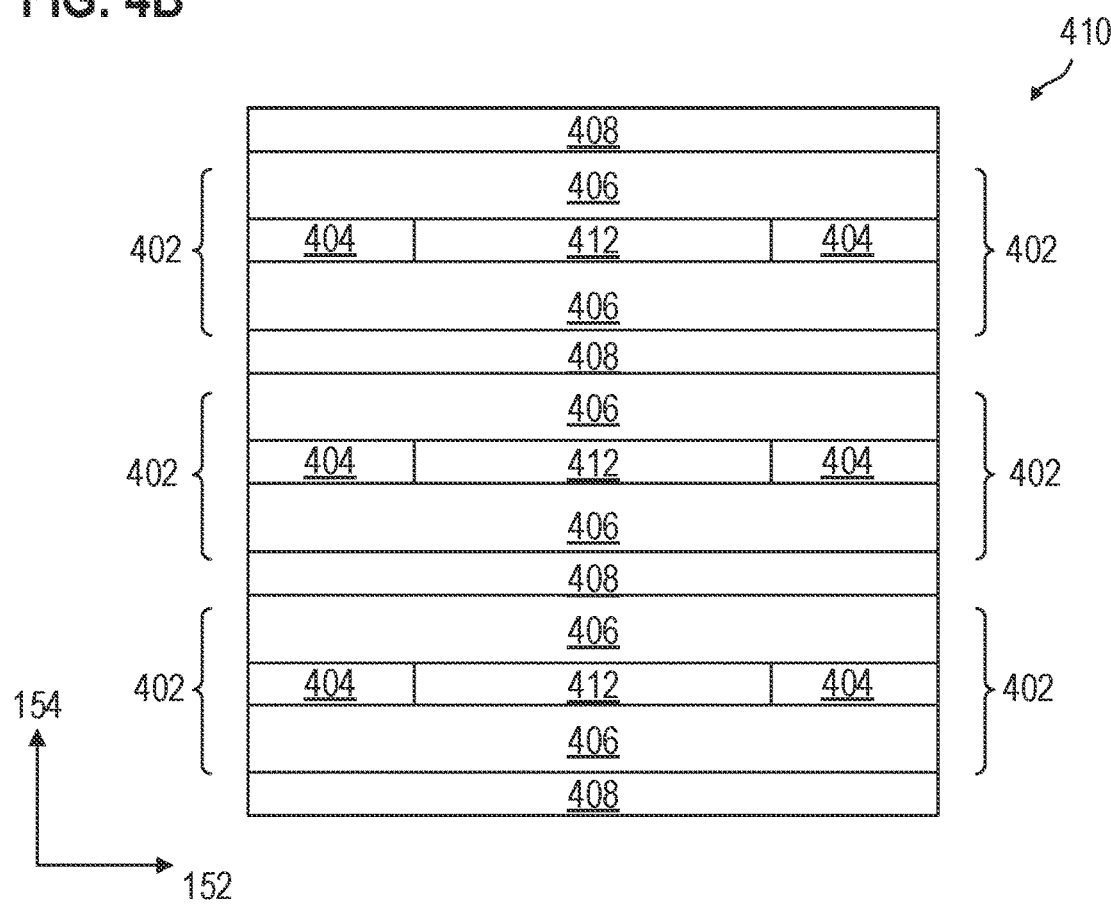
FIG. 4B to FIG. 4G illustrate schematically various aspects of a method of forming a memory device.

The method 400 may include, in 410, forming a plurality of gate layer stacks 402 and a plurality of spontaneously-polarizable portions 412 over a (planar) substrate (see FIG. 4B). The substrate (not shown) may be configured, for example, as the substrate 118a, 118b, 230a, 230b described in relation to FIG. 1A to FIG. 2E, e.g. the substrate may be a semiconductor substrate, such as a silicon wafer. Forming the plurality of gate layer stacks 402 may include forming one or more electrically insulating layers 406 and forming one or more gate electrode layers 404, as described for the method 300 in FIG. 3A to FIG. 3H. The one or more electrically insulating layers 406 and the one or more gate electrode layers 404 may be configured as the electrically insulating layers 110a, 110b, 214a, 214b and the gate electrode layers 108a, 108b, 212a, 212b described in relation to FIG. 1A to FIG. 2E. Illustratively, each gate layer stack 402 may include a gate electrode layer 404 and one or more electrically insulating layers 406. Forming the one or more spontaneously polarizable portions 412 may include patterning the one or more gate electrode layers 404 (e.g., patterning an electrically conductive layer) to create one or more recesses in which the one or more spontaneously polarizable portions 412 are formed. As an example, the one or more spontaneously polarizable portions 412 may be formed by depositing a spontaneously-polarizable material (e.g., ferroelectric hafnium oxide) in the recesses formed in the gate electrode layers 404.

According to various aspects, as shown in FIG. 3B, the method 400 may further include forming one or more gate separation layers 408, e.g. forming a plurality of gate separation layers 408, e.g. one or more (further) electrically insulating layers. The gate separation layer(s) 408 may be configured as the gate separation layers 218a, 218b described in relation to FIG. 2B and FIG. 2C. The method 400 may include forming one or more gate separation layers 408 as described for the method 300 in FIG. 3A to FIG. 3H. A (e.g., each) gate separation layer 408 may be disposed between two adjacent gate layer stacks 402. Illustratively, forming the plurality of gate layer stacks, 410, may include forming a gate separation layer 408 after forming a (first) gate layer stack 402 (and after forming a first spontaneously-polarizable portion 412) and prior to forming another (second) gate layer stack 402 (and prior to forming a second spontaneously-polarizable portion 412). According to various aspects, the one or more gate separation layers 408 may include (e.g., may consist of) a different electrically insulating material with respect to the one or more electrically insulating layers 406 of the gate layer stacks 402.

Figure 4C:
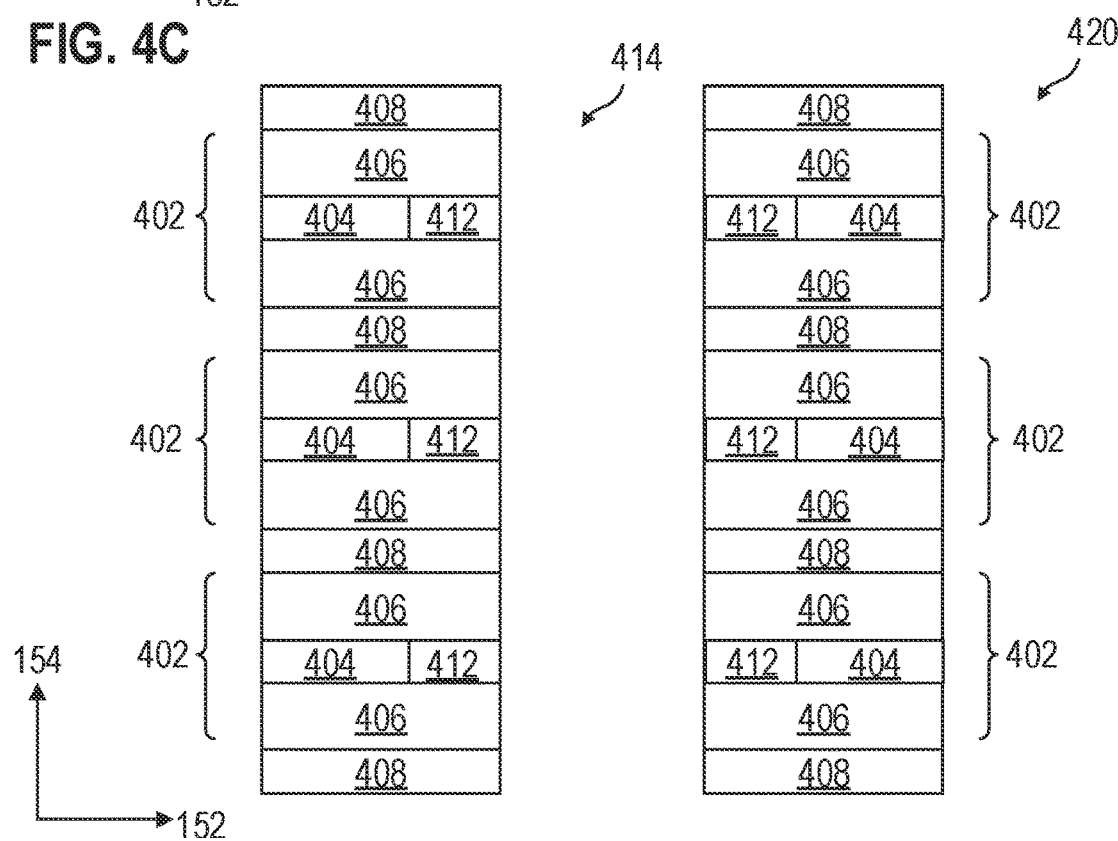
Figure 4D:
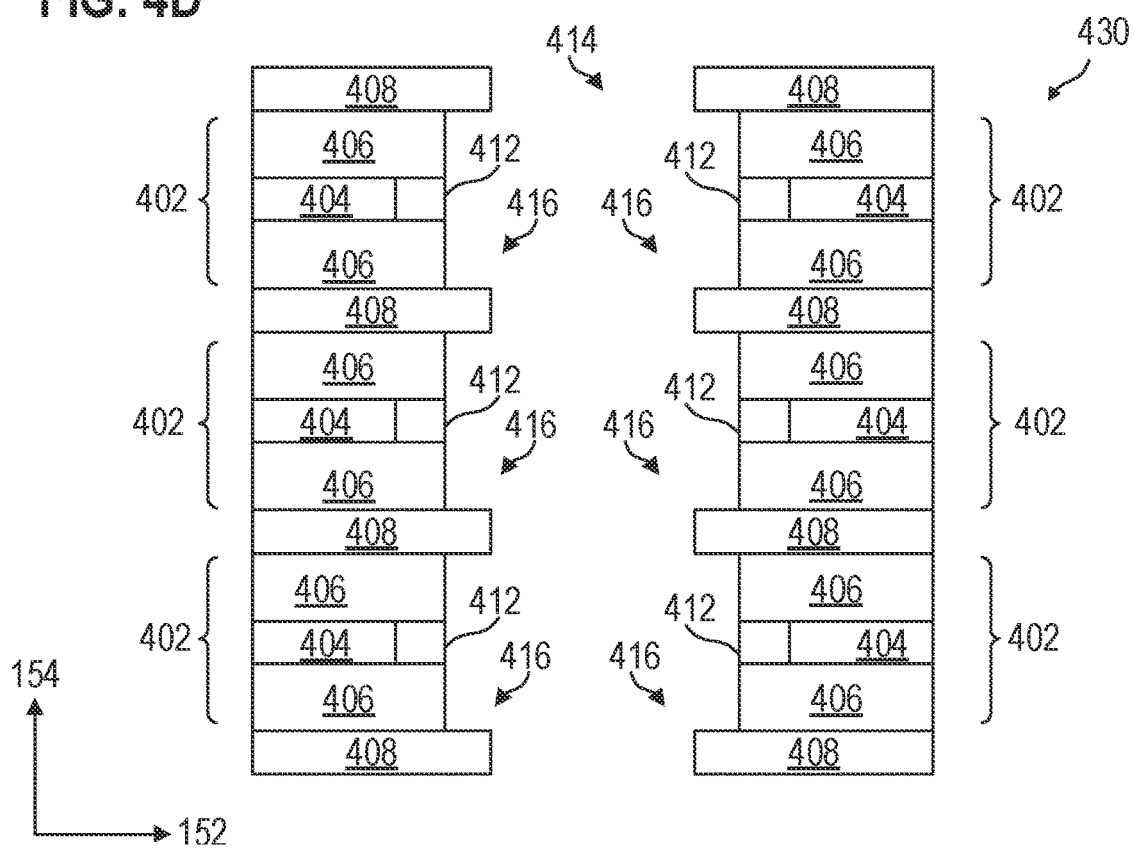

The method 400 may further include, in 420, forming a channel-recess 414 extending through the plurality of gate layer stacks 402 and the plurality of spontaneously-polarizable portions 412 (see FIG. 4C). Illustratively, after deposition of the layer stack, a hole may be formed (e.g., etched) into the layer stack to provide the channel-recess 414. It is understood that the method 400 may include forming any suitable number of channel-recesses 414, e.g. the method 400 may include forming one or more (e.g., a plurality of) channel-recesses 414 extending through the plurality of gate layer stacks 402 and the plurality of spontaneously-polarizable portions 412. In various aspects, forming the channel-recess(es) 414 may include removing a material of the gate layer stacks 402 and a spontaneously-polarizable material of the spontaneously-polarizable portions 412 (e.g., via etching) to expose the substrate in at least a recess 414 extending through the plurality of gate layer stacks 402 and through the plurality of spontaneously-polarizable portions 412. Forming the channel-recess 414 may be carried out as described for the method 300 in FIG. 3A to FIG. 3H.

The method 400 may further include, in 430, forming a plurality of side cavities 416 (see FIG. 3D), e.g. by means of highly selective etching. The method 400 may include creating a plurality of side cavities 416 to accommodate the floating gates of the memory cells (described in further detail below in relation to FIG. 4E). Illustratively, the method 400 may include removing part of the material of the gate layer stacks 402 and of the spontaneously-polarizable portions 412 to create a plurality of side cavities 416.

A (e.g., each) side-cavity 416 may be disposed between a (respective) gate layer portion of a gate layer stack 402 (with a respective spontaneously-polarizable portion 412) and the (respective) channel-recess 412. Illustratively, a side-cavity 416 may be a side-recess extending in a gate layer portion and a spontaneously-polarizable portion 412 in a direction parallel to the substrate (e.g., extending from the channel-recess 414 towards the inside of the gate layer portion).

In some aspects, selective etching to form the plurality of side-cavities 416 may include a plurality of selective etching steps. Illustratively, the method 400 may include a first selective etching to etch the plurality of spontaneously-polarizable portions 412 to form a plurality of partial side-cavities (not shown) and, subsequently, a second selective etching to etch the plurality of electrically insulating layers 406 to form the side-cavities 416 (or vice versa). Illustratively, a first etching may be configured to be selective for the spontaneously-polarizable material of the spontaneously-polarizable portions 412, leaving unetched the material of the one or more electrically insulating layers 406 of the gate layer stacks 402 (and leaving unetched the material of the gate separation portions 408). A second etching may be configured to be selective for the material of one or more electrically insulating layers 406 of the gate layer stacks 402, so that the spontaneously-polarizable portions 412 (and the gate separation portions 408) are not etched in this etching process.

Figure 4E:
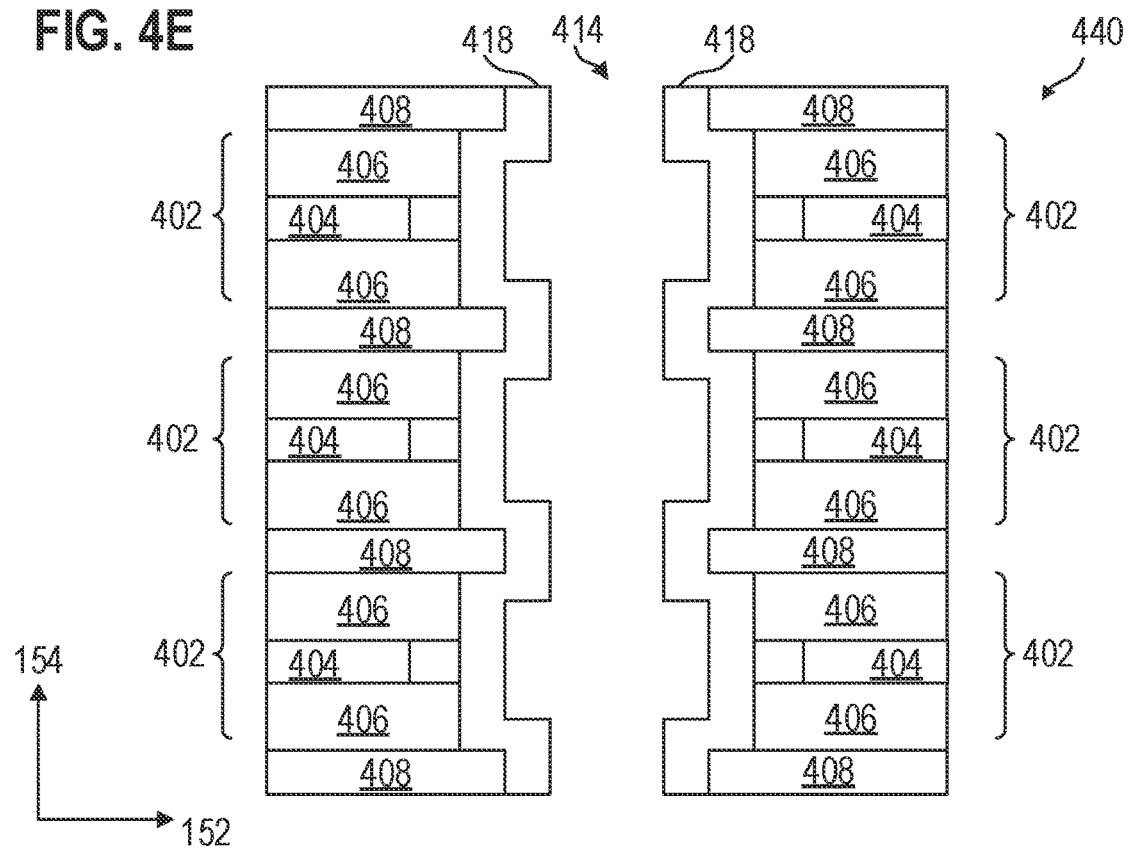

The method 400 may further include, in 440, forming a plurality of floating gates 418 in the formed side-cavities 416 (see FIG. 4E). Illustratively, a (e.g., each) floating gate 418 may be disposed in a (respective) side-cavity 416 of the plurality of side-cavities 416. Forming the plurality of floating gates 418 may include depositing an electrically conductive material (such as a metal, a degenerate semiconductor, and/or the like) in the plurality of side-cavities 416. Forming the plurality of floating gates 418 may include conformally depositing a layer of electrically conductive material in the plurality of side-cavities 416, e.g. by means of conformal deposition (such as atomic layer deposition). Forming the floating gates 418 may be carried out as described for the method 300 in FIG. 3A to FIG. 3H.

Figure 4F:
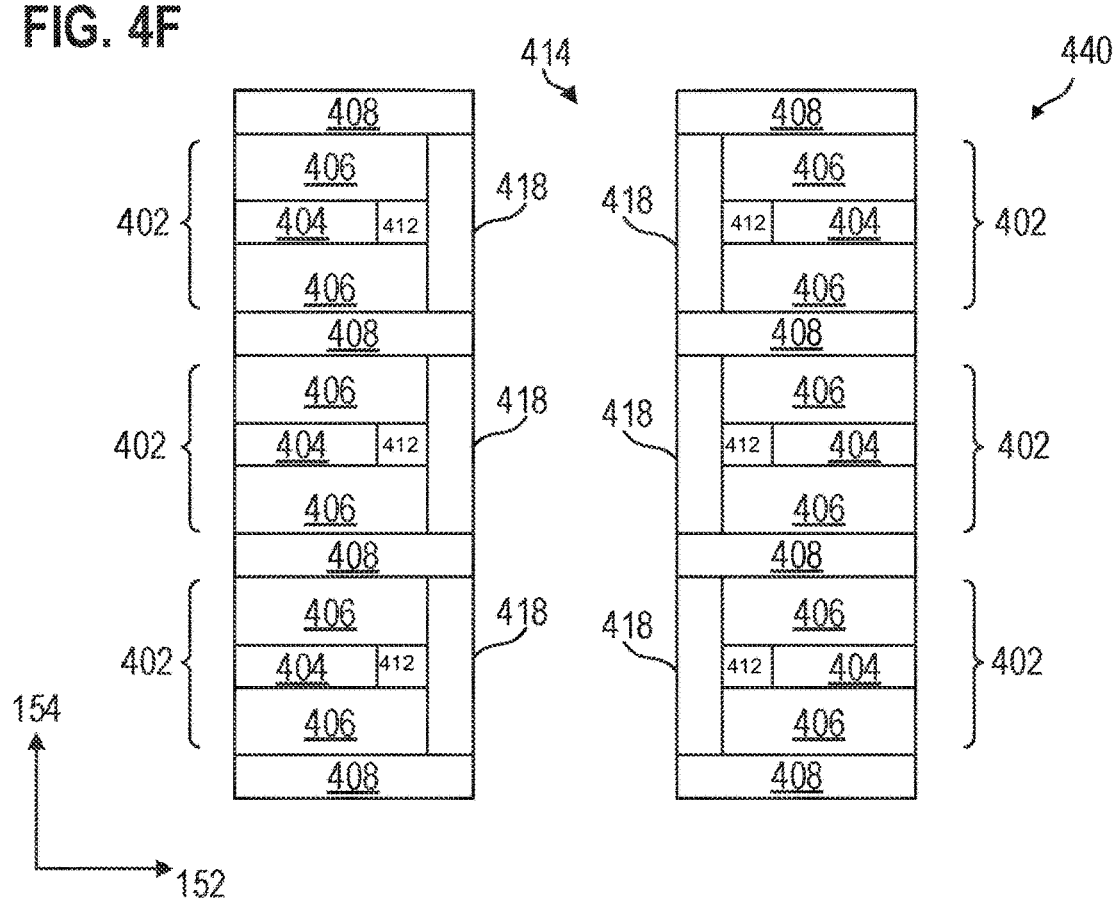

According to various aspects, the method 400 may further include partially removing the electrically conductive material of the formed floating gates 418 in such a way that the channel-recess(es) 414 is/are free of the electrically conductive material (see FIG. 4F). Illustratively, the method 400 may further include removing any excess material of the floating gates 418 from the channel-recess(es) 414. Removing the electrically conductive material of the floating gates 418 may be carried out as described for the method 300 in FIG. 3A to FIG. 3H.

Figure 4G:
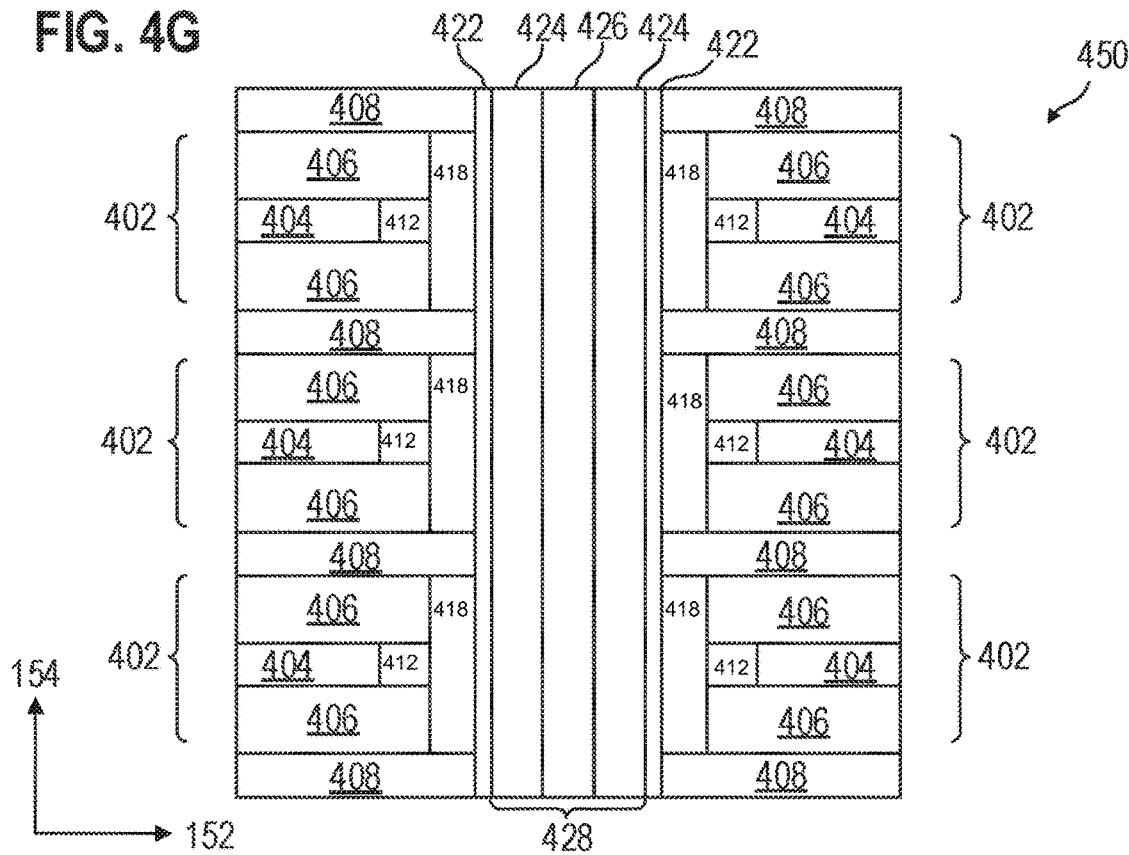

The method 400 may further include, in 450, forming a channel structure 428 in the channel-recess 414 (e.g., the method 400 may include forming a respective channel structure 428 in each channel-recess 414, e.g. the method 400 may include forming one or more channel structures 428, or a plurality of channel structures 428), see FIG. 4G. Forming a channel structure 428 in the channel-recess 414 may be carried out as described for the method 300 in FIG. 3A to FIG. 3H. Illustratively, forming the channel structure 428 in the channel-recess 414 may include forming one or more semiconductor portions 424 in the channel-recess 414.

As an example, forming the channel structure 428 may include: depositing a semiconductor material to form one or more semiconductor portions 424; and providing doped regions in the one or more semiconductor portions 424 to form source/drain regions (e.g., n-doping and p-doping regions of the silicon portion).

According to various aspects, forming the channel structure 428 in the channel-recess 414 may further include forming a channel-isolation structure 422 laterally surrounding the channel-recess 414, as described for the method 300 in FIG. 3A to FIG. 3H, e.g. the method 400 may include forming one or more (e.g., a plurality of) channel-isolation structures 422. Illustratively, the method 400 may include forming a channel-isolation structure 422 in each channel-recess 414. The channel-isolation structure(s) 422 may be formed prior to forming the one or more semiconductor portions 424. The channel isolation structure(s) 422 may be formed between the floating gates 418 and the semiconductor portions 424 of the channel structure 428. As an example, the method 400 may include conformally depositing an electrically insulating material to cover a sidewall of the channel-recess 414 to form the channel-isolation structure(s) 422.

According to various aspects, forming the channel structure 428 in the channel-recess 414 may further include forming a separation portion 426 in the channel-recess 414, as described for the method 300 in FIG. 3A to FIG. 3H. The separation portion 426 may be formed between two semiconductor portions 424 of a channel structure 428, e.g. the separation portion 426 may be an electrically insulating portion disposed between a first semiconductor portion 424 of the channel structure 428 and a second semiconductor portion 424 of the channel structure 428. As an example, forming the separation portion 426 may include forming (or leaving) an air gap in the channel structure 428, e.g. an air gap between a first semiconductor portion 424 of the channel structure 428 and a second semiconductor portion 424 of the channel structure 428. As another example, forming the separation portion 426 may include depositing an electrically insulating material (e.g., an oxide, a nitride, or an oxynitride) in the channel-recess 414, e.g. in a gap between a first semiconductor portion 424 of the channel structure 428 and a second semiconductor portion 424 of the channel structure 428.

According to various aspects, the method 400 may further include dividing the floating gate 412 of a memory cell into one or more floating gates, so that a memory cell may be divided into one or more memory (sub-)cells. As an example, the method 400 may include performing a cut along the center of the channel structure 428 along the vertical direction to separate the memory cells into two (or more) parts, e.g. into two (or more) sub-cells. As another example, the method 400 may further include forming electrically insulating portions between the floating gates of the sub-cells in which a memory cell is divided into.

In the following, various examples are provided that refer to the memory cell 100a, 100b, 202, 202a, 202b, the memory device 200, 200a, 200b, and the methods 300, 400. It is understood that the examples related to the devices may correspondingly apply to the methods, and vice versa.

Example 1 is a memory device including: a plurality of gate layer stacks, wherein each gate layer stack of the plurality of gate layer stacks includes a gate electrode layer and one or more electrically insulating layers; one or more channel structures extending through the plurality of gate layer stacks, wherein the plurality of gate layer stacks and the one or more channel structures correspond to a plurality of field-effect transistor based memory cells, wherein each field-effect transistor based memory cell of the plurality of field-effect transistor based memory cells includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

In Example 2, the memory device of example 1 may optionally further include that the plurality of gate layer stacks includes a first gate layer portion disposed at a first side of a channel structure of the one or more channel structures, and further includes a second gate layer portion disposed at a second side of the channel structure, and that the second side is opposite to the first side.

According to various aspects, a first field-effect transistor based memory cell of the plurality of field-effect transistor based memory cells may include a first floating gate and a first channel portion of a channel structure of the one or more channel structures, a second field-effect transistor based memory cell of the plurality of field-effect transistor based memory cells may include a second floating gate and a second channel portion of the channel structure, and the first field-effect transistor based memory cell and the second field-effect transistor based memory cell may correspond to a same gate layer stack of the plurality of gate layer stacks.

According to various aspects, the first memory cell (the first floating gate) may be disposed at a first side of the channel structure and the second memory cell (the second floating gate) may be disposed at a second side of the channel structure, opposite to the first side. The first memory cell may for example correspond to a first column (e.g., a first string) of memory cells, and the second memory cell disposed at the second side may correspond to a second column (e.g., a second string) of memory cells.

In Example 3, the memory device of example 1 or 2 may optionally further include that the memory device further includes one or more gate separation layers, and that adjacent gate layer stacks of the plurality of gate layer stacks are separated from one another by a gate separation layer of the one or more gate separation layers.

In Example 4, the memory device of example 3 may optionally further include that the one or more gate separation layers include (e.g., consist of) a different electrically insulating material with respect to the one or more electrically insulating layers of a (e.g., each) field-effect transistor based memory cell of the plurality of field-effect transistor based memory cells.

In Example 5, the memory device of any one of examples 1 to 4 may optionally further include that the plurality of field-effect transistor based memory cells are configured to form a 3D-NAND-Architecture.

In Example 6, the memory device of any one of examples 1 to 5 may optionally further include that the channel structure includes one or more semiconductor portions.

In Example 7, the memory device of example 6 may optionally further include that the one or more semiconductor portions include at least two semiconductor portions, and that the channel structure includes at least one separation portion (e.g., an electrically insulating portion) disposed between the at least two semiconductor portions.

In Example 8, the memory device of any one of examples 1 to 7 may optionally further include that the memory device includes a substrate, that the plurality of gate layer stacks are formed over the substrate, that a gate layer stack of the plurality of gate layer stacks includes a first gate layer portion (corresponding to a memory cell) and a second gate layer portion (corresponding to another memory cell), and that the first gate layer portion and the second gate layer portion are spaced from one another along a lateral direction (illustratively, a direction parallel with respect to a main surface of the substrate, e.g. a surface on which the memory device is formed).

In Example 9, the memory device of example 8 may optionally further include that another gate layer stack of the plurality of gate layer stacks includes a third gate layer portion, and that the first gate layer portion and the third gate layer portion are spaced from one another along a vertical direction (illustratively, a direction perpendicular to a main surface of the substrate, e.g. a surface on which the memory device is formed).

In Example 10, the memory device of any one of examples 1 to 9 may optionally further include that the memory device includes a substrate, and that the channel structure extends through the plurality of gate layer stacks along a vertical direction (illustratively, a direction perpendicular to the substrate).

In Example 11, the memory device of any one of examples 1 to 10 may optionally further include that at least one field-effect transistor based memory cell of the plurality of field-effect transistor based memory cells includes a spontaneously-polarizable portion that is U-shaped around the floating gate of the at least one field-effect transistor based memory cell.

In Example 12, the memory device of any one of examples 1 to 11 may optionally further include that at least one field-effect transistor based memory cell of the plurality of field-effect transistor based memory cells includes a spontaneously-polarizable portion that completely laterally surrounds at least three sidewalls of the floating gate of the at least one field-effect transistor based memory cell.

In Example 13, the memory device of any one of examples 1 to 12 may optionally further include that each field-effect transistor based memory cell of the plurality of field-effect transistor based memory cells has a first capacitance and a second capacitance associated therewith, that the first capacitance is associated with the spontaneously-polarizable portion of the field-effect transistor based memory cell, and that the second capacitance is associated with the channel portion corresponding to the field-effect transistor based memory cell.

In Example 14, the memory device of any one of examples 1 to 13 may optionally further include that the memory device further includes one or more channel-isolation structures, and that the one or more channel-isolation structures laterally surround a (respective) sidewall of the one or more channel structures.

In Example 15, the memory device of example 14 may optionally further include that a channel-isolation structure of the one or more channel-isolation structures is disposed between the respective channel structure and the floating gates of the plurality of field-effect transistor based memory cells corresponding to that channel structure.

Example 16 is a memory device including: a plurality of gate layer stacks, wherein each gate layer stack of the plurality of gate layer stacks includes a gate electrode layer and one or more electrically insulating portions; one or more channel structures extending through the plurality of gate layer stacks, wherein the plurality of gate layer stacks and the one or more channel structures are arranged to form a plurality of field-effect transistor based memory cells, wherein each field-effect transistor based memory cell of the plurality of field-effect transistor based memory cells includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

In Example 17, the memory device of example 16 may optionally further include one or more features of any one of examples 1 to 15.

Example 18 is a memory device including: a first memory cell and a second memory cell, wherein the first memory cell includes a first gate layer portion, wherein the first gate layer portion includes a first gate electrode layer and one or more first electrically insulating layers, wherein the second memory cell includes a second gate layer portion, wherein the second gate layer portion includes a second gate electrode layer and one or more second electrically insulating layers; and a channel structure extending through the first gate layer portion and the second gate layer portion, wherein the channel structure includes a first channel portion corresponding to the first memory cell and further includes a second channel portion corresponding to the second memory cell, wherein the first memory cell further includes a first spontaneously-polarizable portion and a first floating gate, wherein the first spontaneously-polarizable portion and the first floating gate are disposed between the first gate layer portion and the first channel portion, wherein the second memory cell further includes a second spontaneously-polarizable portion and a second floating gate, wherein the second spontaneously-polarizable portion and the second floating gate are disposed between the second gate layer portion and the second channel portion, wherein the first gate layer portion, the first floating gate, and the first channel portion form a first field-effect transistor structure, and wherein the second gate layer portion, the second floating gate, and the second channel portion form a second field-effect transistor structure.

In Example 19, the memory device of example 18 may optionally further include one or more features of any one of examples 1 to 15.

Example 20 is a memory device including: a plurality of gate layer stacks, wherein each gate layer stack includes a gate electrode layer and one or more electrically insulating layers; and a channel structure extending through the plurality of gate layer stacks, wherein the plurality of gate layer stacks includes a first gate layer portion corresponding to a first field-effect transistor based memory cell, and further includes a second gate layer portion corresponding to a second field-effect transistor based memory cell, wherein the channel structure includes a first channel portion corresponding to the first field-effect transistor based memory cell and further includes a second channel portion corresponding to the second field-effect transistor based memory cell, wherein a first spontaneously-polarizable portion and a first floating gate are disposed between the first gate layer portion and the first channel portion, wherein a second spontaneously-polarizable portion and a second floating gate are disposed between the second gate layer portion and the second channel portion, wherein the first gate layer portion, the first spontaneously-polarizable portion, the first floating gate, and the first channel portion form the first field-effect transistor based memory cell, and wherein the second gate layer portion, the second spontaneously-polarizable portion, the second floating gate, and the second channel portion form the second field-effect transistor based memory cell.

In Example 21, the memory device of example 20 may optionally further include one or more features of any one of examples 1 to 15.

Example 22 is a field-effect transistor device including: a plurality of gate layer stacks, wherein each gate layer stack of the plurality of gate layer stacks includes a gate electrode layer and one or more electrically insulating layers, one or more channel structures extending through the plurality of gate layer stacks, wherein the plurality of gate layer stacks and the one or more channel structures correspond to a plurality of field-effect transistor structures, wherein each field-effect transistor structure of the plurality of field-effect transistor structures includes: a gate layer portion of a gate layer stack of the plurality of gate layer stacks; a channel portion of a channel structure of the one or more channel structures; a spontaneously-polarizable portion; and a floating gate, wherein the spontaneously-polarizable portion and the floating gate are disposed between the gate layer portion and the channel portion.

In Example 23, the memory device of example 22 may optionally further include one or more features of any one of examples 1 to 15.

Example 24 is a method of forming a memory device, the method including: forming a plurality of gate layer stacks over a (planar) substrate, wherein a gate layer stack of the plurality of gate layer stacks includes a gate electrode layer and one or more electrically insulating layers; forming one or more channel-recesses extending through the plurality of gate layer stacks; forming a plurality of side-cavities, wherein a side-cavity of the plurality of side-cavities is disposed between a gate layer portion of a gate layer stack of the plurality of gate layer stacks and a channel-recess of the one or more channel-recesses; forming a plurality of spontaneously-polarizable portions and a plurality of floating gates, wherein a spontaneously-polarizable portion of the plurality of spontaneously-polarizable portions and a floating gate of the plurality of floating gates are disposed in a side-cavity of the plurality of side-cavities; and forming one or more channel structures portion in the one or more channel-recesses.

In Example 25, the method of example 24 may optionally further include that forming the plurality of gate layer stacks includes forming (e.g., depositing or growing) a plurality of electrically insulating layers and forming (e.g., depositing or growing) a plurality of electrically conductive layers.

In Example 26, the method of example 25 may optionally further include that an electrically conductive layer of the plurality of electrically conductive layers is disposed between two electrically insulating layers of the plurality of electrically insulating layers.

In Example 27, the method of any one of examples 24 to 26 may optionally further include that forming the channel-recess extending through the plurality of gate layer stacks includes etching the plurality of gate layer stacks in a vertical direction (e.g., a direction perpendicular to the substrate, e.g., via Reactive-Ion-Etching, RIE).

In Example 28, the method of any one of examples 24 to 27 may optionally further include that forming the plurality of side-cavities is carried out after forming the one or more channel-recesses.

In Example 29, the method of any one of examples 24 to 28 may optionally further include that forming the plurality of side-cavities includes selectively etching the plurality of gate layer stacks in a lateral direction (e.g., a direction parallel to the substrate).

In Example 30, the method of example 29 may optionally further include that etching the plurality of gate layer stacks in a lateral direction (parallel to the substrate) includes selectively etching the plurality of electrically conductive layers and, subsequently, etching the plurality of electrically insulating layers of the plurality of gate layer stacks.

In Example 31, the method of any one of examples 24 to 30 may optionally further include that forming the plurality of spontaneously-polarizable portions includes depositing a spontaneously-polarizable material in the plurality of side-cavities (e.g., via conformal deposition, e.g. via ALD).

In Example 32, the method of any one of examples 24 to 31 may optionally further include that forming the plurality of floating gates includes depositing an electrically conductive material in the plurality of side-cavities (e.g., via conformal deposition, e.g. via ALD), after depositing the spontaneously-polarizable material.

In Example 33, the method of any one of examples 24 to 32 may optionally further include that forming the plurality of spontaneously-polarizable portions and the plurality of floating gates further includes partially etching the deposited spontaneously-polarizable material and the deposited electrically conductive material to remove the deposited spontaneously-polarizable material and the deposited electrically conductive material from the one or more channel-recesses.

In Example 34, the method of any one of examples 24 to 33 may optionally further include that forming the one or more channel structures in the one or more channel-recesses includes forming one or more semiconductor portions in the one or more channel-recesses.

In Example 35, the method of any one of examples 24 to 34 may optionally further include that forming the one or more channel structures in the one or more channel-recesses further includes forming one or more channel-isolation structures laterally surrounding the one or more channel-recesses (e.g., prior to forming the one or more semiconductor portions).

In Example 36, the method of any one of examples 24 to 35 may optionally further include that forming the one or more channel structures in the one or more channel-recesses further includes forming a separation portion disposed between a first semiconductor portion of a (e.g., each) channel structure and a second semiconductor portion of the channel structure.

Example 37 is a method of forming a memory device, the method including: forming a plurality of gate layer stacks and a plurality of spontaneously-polarizable portions over a substrate, wherein a gate layer stack of the plurality of gate layer stacks includes a gate electrode layer and one or more electrically insulating layers, and wherein forming a spontaneously-polarizable portion of the plurality of spontaneously-polarizable portions includes forming a recess in a gate electrode layer and forming the spontaneously-polarizable portion in the recess; forming one or more channel-recesses extending through the plurality of gate layer stacks and the plurality of spontaneously-polarizable portions; forming a plurality of side-cavities, wherein a side-cavity of the plurality of side-cavities is disposed between a spontaneously-polarizable portion of the plurality of spontaneously-polarizable portions and a respective channel-recess of the one or more channel-recesses; forming a plurality of floating gates, wherein a floating gate of the plurality of floating gates is disposed in a side-cavity of the plurality of side-cavities; and forming one or more channel structures in the one or more channel-recesses.

In Example 38, the method of example 37 may optionally further include one or more features of any one of examples 24 to 36.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "coupled to" used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least 105 S/m at a temperature of 20° C.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g., a layer, a substrate, a wafer, etc.) or "laterally" next to, may be used herein to mean an extent or a positional relationship along a surface of the carrier. That means, in some aspects, that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. As an example, considering a capacitor structure, a width may be a dimension parallel to the plates of the capacitor structure, and a thickness may be a dimension perpendicular to the plates of the capacitor structure. Further, the term "height" used with regards to a height of a structure, a portion, a structure element, a layer, etc., may be used herein to mean a dimension (in other words an extent) of a structure in a direction perpendicular to the surface of a carrier (e.g., perpendicular to the main processing surface of a carrier).

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

In some aspects, the term region may be used with regards to a "source region", "drain region", "channel region", and the like, to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The term "switch" may be used herein to describe a modification of the memory state a memory cell is residing in. For example, in the case that a memory cell is residing in a first memory state (e.g., a LVT state), the memory state the memory cell is residing in may be switched such that, after the switch, the memory cell may reside in a second memory state (e.g., a HVT state), different from the first memory state. The term "switch" may thus be used herein to describe a modification of the memory state a memory cell is residing in, from a first memory state to a second memory state. The term "switch" may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

According to various aspects, the properties and/or the structure of a region of a memory element may be evaluated with techniques known in the art. As an example, transmission electron microscopy (TEM) may be used to determine the structure of a material or a layer. TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material, e.g. the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g. for analyzing the spatial distribution (e.g., the gradient) of an element across the solid. As a further example, neutron diffraction (also referred to as elastic neutron scattering) may be used to determine the atomic structure of a material.

To evaluate the material properties of a region of a memory element, the capacitive memory structure may be cut to expose a side of the memory element, so that the regions of the memory element may be investigated, e.g. with the techniques mentioned above. A memory element structured as described herein may thus have varying material properties along a horizontal direction, e.g. based on the arrangement of the first and second regions. A horizontal direction may be understood as a direction parallel to the substrate on which the capacitive memory structure is formed. Furthermore, a horizontal direction may be understood as a direction perpendicular to a length (illustratively, a depth) of a region. Illustratively, a memory element may have regions disposed side-by-side, with different material properties with respect to one another, which may be evaluated by suitably exposing the regions for performing an analysis.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The expression "a material of . . . ", e.g., a portion or a layer (or a structure), may be used herein to describe a main component of that portion or layer (or structure), e.g., a main material (for example, a main chemical element or a main compound) present in that portion or layer (or structure). The expression "a material of . . . ", e.g., a portion or a layer may describe, in some aspects, the material of that portion or layer having a weight percentage greater than 80% over the total weight of the materials that the portion or layer include(s), for example having a weight percentage greater than 90% over the total weight of the materials that the portion or layer include(s). The expression "a material of . . . ", e.g., a portion or a layer may describe, in some aspects, the material of that portion or layer having a volume percentage greater than 80% over the total volume of the materials that the portion or layer include(s), for example having a volume percentage greater than 90% over the total volume of the materials that the portion or layer include(s). As an example, a material of a layer including aluminum may describe that such layer is formed mostly by aluminum, and that other chemical elements or compounds (e.g., impurities) may be present in a smaller proportion, e.g., having less weight percentage or less volume percentage compared to aluminum. As another example, a material of a layer including titanium nitride may describe that such layer is formed mostly by titanium nitride, and that other elements or compounds (e.g., impurities) may be present in a smaller proportion, e.g., having less weight percentage or less volume percentage compared to titanium nitride.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory device comprising:
   a plurality of gate layer stacks, wherein each gate layer stack of the plurality of gate layer stacks comprises a gate electrode layer and one or more electrically insulating layers;
   one or more channel structures extending through the plurality of gate layer stacks,
   wherein the plurality of gate layer stacks and the one or more channel structures correspond to a plurality of field-effect transistor based memory cells of the memory device,
   wherein a first field-effect transistor based memory cell of the plurality of field-effect transistor based memory cells comprises:
      a first gate layer portion of a first gate layer stack of the plurality of gate layer stacks;
      a first channel portion of a channel structure of the one or more channel structures;
      a spontaneously-polarizable portion; and
      a first floating gate,
   wherein the spontaneously-polarizable portion and the first floating gate are disposed between the first gate layer portion and the first channel portion, and
   wherein a height of the spontaneously-polarizable portion is less than a height of the first floating gate when measured along an axis parallel to a longitudinal axis of the one or more channel structures.

2. The memory device according to claim 1,
   wherein a second field-effect transistor based memory cell of the plurality of field-effect transistor based memory cells comprises a second floating gate and a second channel portion of the channel structure, and
   wherein the first field-effect transistor based memory cell and the second field-effect transistor based memory cell correspond to the first gate layer stack of the plurality of gate layer stacks.

3. The memory device according to claim 2,
   wherein the first floating gate is disposed at a first side of the channel structure,
   wherein the second floating gate is disposed at a second side of the channel structure, and
   wherein the first side is opposite to the second side.

4. The memory device according to claim 1,
   wherein the memory device further comprises one or more gate separation layers, and
   wherein adjacent gate layer stacks of the plurality of gate layer stacks are separated from one another by a gate separation layer of the one or more gate separation layers.

5. The memory device according to claim 4,
   wherein the one or more electrically insulating layers comprise a first electrically insulating material and the one or more gate separation layers comprise a second electrically insulating material different from the first electrically insulating material.

6. The memory device according to claim 1,
   wherein at least one channel structure of the one or more channel structures comprises at least two semiconductor portions, and
   wherein the at least one channel structure comprises at least one separation portion disposed between the at least two semiconductor portions.

7. The memory device according to claim 1,
   wherein a second gate layer stack of the plurality of gate layer stacks comprises a second gate layer portion corresponding to a second field-effect transistor based memory cell of the plurality of field-effect transistor based memory cells, and
   wherein the first gate layer portion and the second gate layer portion are spaced from one another along a vertical direction.

8. The memory device according to claim 7,
   wherein a third gate layer stack further comprises a third gate layer portion corresponding to a third field-effect transistor based memory cell of the plurality of field-effect transistor based memory cells, and wherein the first gate layer portion and the third gate layer portion are spaced from one another along a lateral direction.

9. The memory device according to claim 1, wherein the one or more channel structures extend through the plurality of gate layer stacks along a vertical direction.

10. The memory device according to claim 1, wherein the spontaneously-polarizable portion is U-shaped around the first floating gate of the first field-effect transistor based memory cell.

11. The memory device according to claim 1, wherein the spontaneously-polarizable portion completely laterally surrounds at least three sidewalls of the first floating gate of the first field-effect transistor based memory cell.

12. The memory device according to claim 1, wherein each field-effect transistor based memory cell of the plurality of field-effect transistor based memory cells has a first capacitance and a second capacitance associated therewith,
wherein the first capacitance is associated with a first spontaneously-polarizable portion of the field-effect transistor based memory cell, and
wherein the second capacitance is associated with a channel portion associated with the field-effect transistor based memory cell.

13. The memory device according to claim 1, wherein the memory device further comprises one or more channel-isolation structures, and
wherein the one or more channel-isolation structures laterally surround a sidewall of the one or more channel structures.

14. The memory device according to claim 13, wherein a first channel-isolation structure of the one or more channel-isolation structures is disposed between a first channel structure of the one or more channel structures and a floating gate corresponding to the first channel structure.

15. A memory device comprising:
a first memory cell and a second memory cell,
wherein the first memory cell comprises a first gate layer portion,
wherein the first gate layer portion comprises a first gate electrode layer and one or more first electrically insulating layers,
wherein the second memory cell comprises a second gate layer portion,
wherein the second gate layer portion comprises a second gate electrode layer and one or more second electrically insulating layers; and
a channel structure extending through the first gate layer portion and the second gate layer portion,
wherein the channel structure comprises a first channel portion associated with the first memory cell and further comprises a second channel portion associated with the second memory cell,
wherein the first memory cell further comprises a first spontaneously-polarizable portion and a first floating gate, wherein the first spontaneously-polarizable portion and the first floating gate are disposed between the first gate layer portion and the first channel portion,
wherein the second memory cell further comprises a second spontaneously-polarizable portion and a second floating gate, wherein the second spontaneously-polarizable portion and the second floating gate are disposed between the second gate layer portion and the second channel portion,
wherein the first gate layer portion, the first floating gate, and the first channel portion form a first field-effect transistor structure,
wherein the second gate layer portion, the second floating gate, and the second channel portion form a second field-effect transistor structure,
wherein a height of the first spontaneously-polarizable portion is less than a height of the first floating gate when measured along an axis parallel to a longitudinal axis of the channel structure, and
wherein a height of the second spontaneously-polarizable portion is less than a height of the second floating gate when measured along the axis parallel to the longitudinal axis of the channel structure.

16. The memory device according to claim 15, wherein the first memory cell and the second memory cell are spaced apart from one another along a vertical direction.

17. A memory device comprising:
a plurality of gate layer stacks, wherein each gate layer stack of the plurality of gate layer stacks comprises a gate electrode layer and one or more electrically insulating layers; and
one or more channel structures extending through the plurality of gate layer stacks,
wherein the plurality of gate layer stacks and the one or more channel structures correspond to a plurality of field-effect transistor based memory cells of the memory device,
wherein a first field-effect transistor based memory cell of the plurality of field-effect transistor based memory cells comprises:
a first gate layer portion of a first gate layer stack of the plurality of gate layer stacks;
a first channel portion of a channel structure of the one or more channel structures;
a spontaneously-polarizable portion; and
a first floating gate,
wherein the spontaneously-polarizable portion and the first floating gate are disposed between the first gate layer portion and the first channel portion, and
wherein the spontaneously-polarizable portion is U-shaped around the first floating gate of the first field-effect transistor based memory cell.

18. The memory device of claim 17, wherein the spontaneously-polarizable portion being U-shaped around the first floating gate of the first field-effect transistor based memory cell comprises the spontaneously-polarizable portion contacting at least two sides of the floating gate.

19. The memory device according to claim 17, wherein a second field-effect transistor based memory cell of the plurality of field-effect transistor based memory cells comprises a second floating gate and a second channel portion of the channel structure, and
wherein the first field-effect transistor based memory cell and the second field-effect transistor based memory cell correspond to the first gate layer stack of the plurality of gate layer stacks.

20. The memory device according to claim 17,
wherein the first floating gate is disposed at a first side of the channel structure,
wherein the second floating gate is disposed at a second side of the channel structure, and
wherein the first side is opposite to the second side.

\* \* \* \* \*